United States Patent
Tada et al.

(10) Patent No.: US 7,737,005 B2
(45) Date of Patent: Jun. 15, 2010

(54) METHOD FOR FORMING TI FILM AND TIN FILM, CONTACT STRUCTURE, COMPUTER READABLE STORING MEDIUM AND COMPUTER PROGRAM

(75) Inventors: Kunihiro Tada, Nirasaki (JP); Kensaku Narushima, Nirasaki (JP); Satoshi Wakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 725 days.

(21) Appl. No.: 11/547,977

(22) PCT Filed: Apr. 8, 2005

(86) PCT No.: PCT/JP2005/006947

§ 371 (c)(1),
(2), (4) Date: Oct. 10, 2006

(87) PCT Pub. No.: WO2005/098913

PCT Pub. Date: Oct. 20, 2005

(65) Prior Publication Data

US 2007/0257372 A1    Nov. 8, 2007

(30) Foreign Application Priority Data

Apr. 9, 2004   (JP) .............................. 2004-115960

(51) Int. Cl.
*H01L 21/322*   (2006.01)

(52) U.S. Cl. .................. 438/477; 438/905; 438/906; 438/974; 438/471

(58) Field of Classification Search ............... 438/58, 438/115, 143, 310, 402, 471–477, 905, 906, 438/144–147, 370, 974; 257/E21.224–E21.229
See application file for complete search history.

(56) References Cited

U.S. PATENT DOCUMENTS

| | | | | |
|---|---|---|---|---|
| 5,963,833 A | * | 10/1999 | Thakur | 438/677 |
| 6,020,024 A | * | 2/2000 | Maiti et al. | 438/287 |
| 6,051,281 A | * | 4/2000 | Kobayashi et al. | 427/535 |
| 6,713,392 B1 | * | 3/2004 | Ngo et al. | 438/682 |
| 2004/0097060 A1 | * | 5/2004 | San et al. | 438/592 |

FOREIGN PATENT DOCUMENTS

| | | |
|---|---|---|
| JP | 11 040518 | 2/1999 |
| JP | 11 233453 | 8/1999 |
| JP | 2000 208436 | 7/2000 |
| JP | 2001 523 043 | 11/2001 |
| JP | 2002 203812 | 7/2002 |
| JP | 2003 059861 | 2/2003 |
| JP | 2003 119564 | 4/2003 |

* cited by examiner

*Primary Examiner*—N Drew Richards
*Assistant Examiner*—Swapneel Chhaya
(74) *Attorney, Agent, or Firm*—Oblon, Spivak, McClelland, Maier & Neustadt, L.L.P.

(57) ABSTRACT

A cleaning process is performed on the surface of a nickel silicide film serving as an underlayer. Then, a Ti film is formed to have a film thickness of not less than 2 nm but less than 10 nm by CVD using a Ti compound gas. Then, the Ti film is nitrided. Then, a TiN film is formed on the Ti film thus nitrided, by CVD using a Ti compound gas and a gas containing N and H.

15 Claims, 13 Drawing Sheets

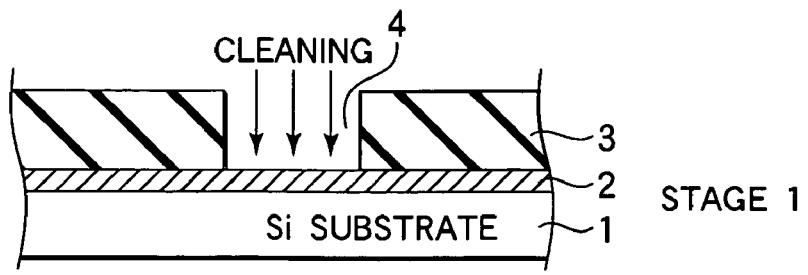
FIG.1A STAGE 1
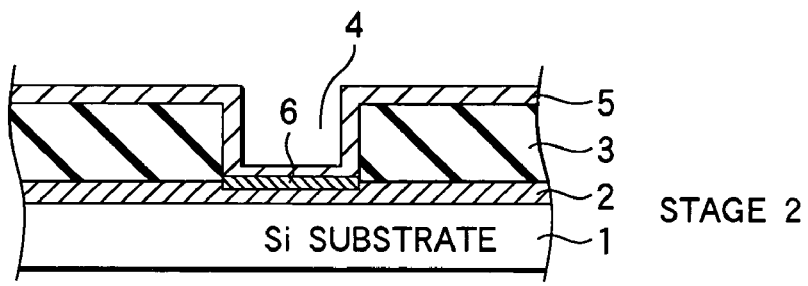
FIG.1B STAGE 2
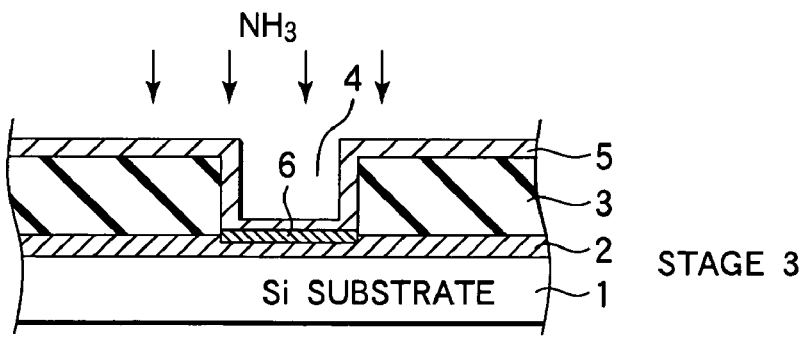
FIG.1C STAGE 3
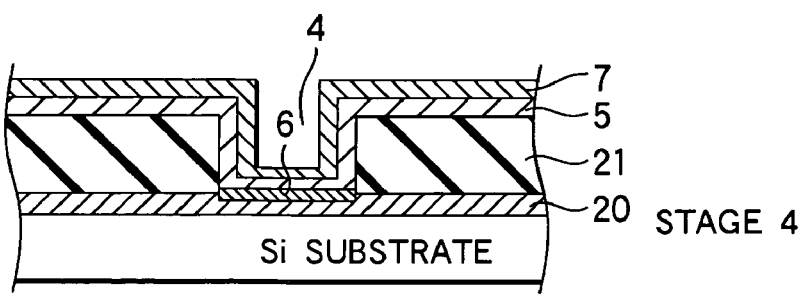
FIG.1D STAGE 4

METHOD FOR FORMING TI FILM AND TIN FILM, CONTACT STRUCTURE, COMPUTER READABLE STORING MEDIUM AND COMPUTER PROGRAM

TECHNICAL FIELD

The present invention relates to a film formation method for forming a Ti film and a TiN film, and a contact structure, which are used in contact holes and via-holes of semiconductor devices. The present invention further relates to a computer readable storage medium and a computer program.

BACKGROUND ART

In manufacturing semiconductor devices, as higher density and higher integration degree are required to the devices, multi-layered wiring structures are being increasingly used for circuitry. Under the circumstances, embedding techniques for electrical connection between layers have become important, for example, at contact holes used as connection portions between an Si substrate or poly-crystalline silicon layer on the lower side and wiring layers on the upper side, and at via-holes used as connection portions between upper and lower wiring layers.

In general, a metal, such as Al or W, or an alloy made mainly of these materials is used as a material for filling such contact holes and via-holes. In this case, it is necessary to form good contact between the metal or alloy and an underlayer, such as an Si substrate or poly-crystalline silicon layer. For this reason, before filling a filler material, a Ti film is formed on the inner surface of the holes and is caused to react with the underlying Si to thereby form a titanium silicide (TiSi) film as a contact layer. Then, a TiN film is further formed thereon as a barrier metal layer for the filler material.

In order to form Ti films or TiN films of this kind, chemical vapor deposition (CVD) is utilized, because this method can suppress increase in the electric resistance, provide the films with good quality, and attain high step coverage, even where devices are miniaturized and highly integrated.

Where a Ti film and a TiN film are formed by CVD, $TiCl_4$ is used as a film formation gas, and thus $Cl_2$ and HCl are generated as reaction products. When the TiN film is formed after the Ti film is formed, these reaction products act to etch the Ti film. This etching action brings about a problem such that the TiN film peels off the Ti film due to an insufficient adhesion degree between the Ti film and the upper layer or TiN film, and a thermal stress or the like applied when a filler metal film is formed.

Conventionally, in order to solve this problem, after the Ti film is formed, $NH_3$ gas is supplied to nitride the Ti film, and then the TiN film is formed. According to this method, the Ti film is nitrided and is thereby prevented from being etched by $Cl_2$ and HCl, so no film peeling is caused on the Ti film.

In recent years, in order to increase the operational speed of devices, there is a case where another metal silicide, such as cobalt silicide ($CoSi_2$), is formed, in place of titanium silicide (TiSi), as a contact layer at the interface between the underlying Si and Ti film to be formed. This is adopted, because such a metal silicide provides the underlayer with a better contact property for the Ti film. For example, Patent Document 1 proposes a method for forming a Ti/TiN film on a cobalt silicide film disposed on the bottom of a contact hole. Patent Document 1 describes a method for forming a Ti film on a cleaned surface of the cobalt silicide film to form a good interface. Further, in recent years, as a metal silicide effective for logic contact, nickel silicide (NiSi or the like) has attracted attention. However, nickel silicide causes a phase transition from NiSi to a higher resistivity phase ($Ni_5Si_2$ or $Ni_3Si$) when exceeding 500° C. Accordingly, where a Ti/TiN film is formed on a nickel silicide film at a high temperature of 500° C. or more, the nickel silicide film is changed from NiSi to a higher resistivity phase and increases the resistivity, thereby rendering a higher contact resistance. In order to prevent this problem, it is necessary to perform the Ti film formation, Ti film nitriding process, and TiN film formation at a film formation temperature of 500° C. or less, where the Ti/TiN film is formed on the nickel silicide film. For this reason, the Ti film formation, Ti film nitriding process, and TiN film formation have required the film formation to be performed at a lower temperature of 500° C. or less. Further, in recent years, due to miniaturization of devices, impurity diffusion layers formed in Si substrates have become thinner. This makes it more important to prevent the impurity diffusion layers from causing re-diffusion due to high temperature processes. Accordingly, it is also required to perform film formation at a lower temperature and to decrease the film thickness, where a Ti/TiN film is formed on an Si substrate.

However, Patent Document 1 described above pays no attention to such low temperature film formation. Where film formation is performed at a low temperature of 500° C. or less for the Ti film formation, Ti film nitriding process, and TiN film formation, there are differences described below, as compared to a case where the film formation is performed at a relatively high temperature of 600° C. or more, as conventionally used. Specifically, when the nitriding process is performed after the Ti film formation, the Ti film is not sufficiently nitrided. If the TiN film formation is performed after such insufficient nitridation, those portions of the Ti film (on the interface side adjacent to the underlayer) which have not been nitrided are etched by reaction products derived from the film formation gas, as described above. Consequently, the TiN film may peel off the Ti film due to an insufficient adhesion degree between the Ti film and the upper layer or TiN film, and a thermal stress or the like applied when a filler metal film is formed. Furthermore, even where film formation is performed at a low temperature of 500° C. or less, the contact resistance may become higher.

[Patent Document 1] Jpn. Pat. Appln. KOKAI Publication No. 2003-59861

DISCLOSURE OF INVENTION

An object of the present invention is to provide a film formation method for forming a Ti film and a TiN film, which can decrease the contact resistance and can suppress the film peeling, even where the film formation is performed at a low temperature in forming the Ti film and TiN film on an underlayer, such as an Si substrate or a metal silicide film disposed on a substrate. This object of the present invention is further conceived to provide a contact structure formed by such a film formation method, and a computer readable storage medium and a computer program for performing control to execute such a film formation method.

According to a first aspect of the present invention, there is provided a film formation method for forming a Ti film and a TiN film on an underlayer comprising an Si-containing substrate or a metal silicide film disposed on a substrate comprising: cleaning a surface of the underlayer; forming a Ti film to have a film thickness of not less than 2 nm but less than 10 nm on the underlayer by CVD using a Ti compound gas; nitriding the Ti film; and forming a TiN film on the Ti film thus nitrided, by CVD using a Ti compound gas and a gas containing N and H.

According to a second aspect of the present invention, there is provided a film formation method for forming a Ti film and a TiN film on an underlayer comprising an Si-containing substrate or a metal silicide film disposed on a substrate comprising: cleaning a surface of the underlayer; forming a Ti film to have a film thickness of not less than 2 nm but less than 10 nm by CVD using a Ti compound gas; nitriding the Ti film; and forming a TiN film on the Ti film thus nitrided, by alternately repeating, a plurality of times, a first step of supplying a Ti compound gas and a gas containing N and H, and a second step of stopping the Ti compound gas and supplying the gas containing N and H.

According to a third aspect of the present invention, there is provided a film formation method for forming a Ti film and a TiN film on a nickel silicide film disposed on a substrate comprising: cleaning a surface of the nickel silicide film; forming a Ti film to have a film thickness of not less than 2 nm but less than 10 nm by CVD using a Ti compound gas, and thereby forming a reaction layer of nickel silicide with Ti at an interface between the nickel silicide film and the Ti film; nitriding the Ti film; and forming a TiN film on the Ti film thus nitrided, by alternately repeating, a plurality of times, a first step of supplying a Ti compound gas and a gas containing N and H, and a second step of stopping the Ti compound gas and supplying the gas containing N and H.

According to a fourth aspect of the present invention, there is provided a contact structure disposed on an underlayer comprising an Si substrate or a metal silicide film, the contact structure comprising: a reaction layer of Si or metal silicide with Ti formed on the underlayer; and a TiN film formed on the reaction layer and having a two-layer structure, wherein the contact structure has been prepared by forming a Ti film to have a film thickness of not less than 2 nm but less than 10 nm on the underlayer by CVD using a Ti compound gas; nitriding the Ti film; and forming a TiN film on the Ti film thus nitrided, by CVD using a Ti compound gas and a gas containing N and H.

According to a fifth aspect of the present invention, there is provided a contact structure disposed on a nickel silicide film and comprising: a reaction layer of nickel silicide with Ti formed on the nickel silicide film; and a TiN film formed on the reaction layer and having a two-layer structure, wherein the contact structure has been prepared by forming a Ti film to have a film thickness of not less than 2 nm but less than 10 nm on the nickel silicide film by CVD using a Ti compound gas; nitriding the Ti film; and forming a TiN film on the Ti film thus nitrided, by CVD using a Ti compound gas and a gas containing N and H.

According to a sixth aspect of the present invention, there is provided a computer readable storage medium that stores a software for a computer to execute a control program, which, when executed, controls a film formation apparatus to perform film formation for forming a Ti film and a TiN film on an underlayer comprising an Si-containing substrate or a metal silicide film disposed on a substrate, wherein the film formation comprises cleaning a surface of the underlayer; forming a Ti film to have a film thickness of not less than 2 nm but less than 10 nm on the underlayer by CVD using a Ti compound gas; nitriding the Ti film; and forming a TiN film on the Ti film thus nitrided, by CVD using a Ti compound gas and a gas containing N and H.

According to a seventh aspect of the present invention, there is provided a computer program comprising a software for execution on a computer, which, when executed, controls a film formation apparatus to perform film formation for forming a Ti film and a TiN film on an underlayer comprising an Si-containing substrate or a metal silicide film disposed on a substrate, wherein the film formation comprises cleaning a surface of the underlayer; forming a Ti film to have a film thickness of not less than 2 nm but less than 10 nm on the underlayer by CVD using a Ti compound gas; nitriding the Ti film; and forming a TiN film on the Ti film thus nitrided, by CVD using a Ti compound gas and a gas containing N and H.

In the film formation method for Ti and TiN films described above, said cleaning a surface of the underlayer, typically a surface of the NiSi film, may comprise performing sputter etching by use of plasma. The sputter etching by use of plasma may be performed by use of inductively coupled plasma. The sputter etching by use of plasma may be preferably performed by use of Ar gas.

In the film formation method for Ti and TiN films described above, said cleaning a surface of the underlayer, typically a surface of the NiSi film, may be performed by use of an excited gas. Further, said cleaning a surface of the underlayer may comprise: generating plasma of a gas containing H and/or a gas containing N; supplying the plasma into a process container that accommodates an Si substrate; supplying $NF_3$ gas into the process container to excite the $NF_3$ gas by the plasma; and performing cleaning by use of the $NF_3$ gas thus excited. In this case, the substrate may be subjected to a heat process to thermally decompose and sublimate formed reaction products after causing an excited gas to act on the surface of the underlayer.

In the film formation method for Ti and TiN films described above, said cleaning a surface of the underlayer, typically a surface of the NiSi film, may comprise supplying a plurality of gases onto the surface of the underlayer to cause a chemical reaction on the surface of the underlayer. Further, said cleaning a surface of the underlayer may comprise supplying HF gas and $NH_3$ gas onto the surface of the underlayer. In this case, the substrate may be subjected to a heat process to thermally decompose and sublimate formed reaction products after supplying HF gas and $NH_3$ gas onto the surface of the underlayer to cause a chemical reaction.

In the film formation method for Ti and TiN films described above, the TiN film is preferably set to have a film thickness of 3 nm or more and 50 nm or less. Further, said forming a Ti film is preferably performed at a substrate temperature of 300 to 500° C.

In the film formation method for Ti and TiN films described above, the metal silicide on a substrate surface may be silicide of a metal selected from the group consisting of Ni, Co, Mo, W, Pt, and Pd.

According to the present invention, a Ti film and a TiN film are formed on an underlayer comprising an Si substrate or a metal silicide film, such as a nickel silicide (NiSi), disposed on a substrate. Before the Ti film is formed, the surface of the underlayer is cleaned by a suitable method. Then, the Ti film is formed to have a film thickness of not less than 2 nm but less than 10 nm on the underlayer by CVD using a Ti compound gas. In this case, a reaction layer of Ti with the underlayer is preferably formed to decrease the contact resistance. Further, the Ti film is prepared to be sufficiently nitrided. Consequently, even where the film formation is performed at a low temperature, it is possible to decrease the contact resistance and to effectively prevent the film peeling on the Ti film.

When the TiN film is formed, a first step and a second step may be alternately repeated a plurality of times. The first step is arranged to supply a Ti compound gas and a gas containing N and H. The second step is arranged to stop the Ti compound gas and supply the gas containing N and H. Accordingly, a TiN film formed in the first step is efficiently subjected to dechlorination by annealing in the second step. In this case, even where the film formation is performed at a low temperature, the TiN film is formed to have good film quality with little residual chlorine and a low resistivity. Consequently, it is possible to more effectively suppress occurrence of cracks in the TiN film, and to reliably prevent film peeling of the TiN film.

The cleaning process for the surface of the underlayer may be performed by sputter etching by use of plasma before the Ti film is formed. In this case, natural oxide films on the surface of the underlayer are efficiently removed to improve the reactivity between the surface of the underlayer and Ti.

The cleaning process for the surface of the underlayer may be performed by use of a gas excited by, e.g., remote plasma. In this case, the cleaning process is performed mainly by a chemical action, and the underlayer is less damaged during the cleaning process. Reaction products formed due to the chemical action are then thermally decomposed and sublimated by, e.g., a heat process. Consequently, the natural oxide films on the surface of the underlayer can be completely removed.

The cleaning process for the surface of the underlayer may be performed by supplying a plurality of gases, such as HF gas and $NH_3$ gas, onto the surface of the underlayer to cause a chemical reaction thereon. In this case, it is possible to perform the cleaning process with even lower damage to the underlayer. Reaction products formed due to the chemical action are then thermally decomposed and sublimated by, e.g., a heat process. Consequently, the natural oxide films on the surface of the underlayer can be completely removed.

BRIEF DESCRIPTION OF DRAWINGS

FIG. 1A is a process view for explaining one of the stages of a method for forming a Ti film and a TiN film according to a first embodiment of the present invention.

FIG. 1B is a process view for explaining one of the stages of the method for forming a Ti film and a TiN film according to the first embodiment of the present invention.

FIG. 1C is a process view for explaining one of the stages of the method for forming a Ti film and a TiN film according to the first embodiment of the present invention.

FIG. 1D is a process view for explaining one of the stages of the method for forming a Ti film and a TiN film according to the first embodiment of the present invention.

BEST MODE FOR CARRYING OUT THE INVENTION

Figure 2:
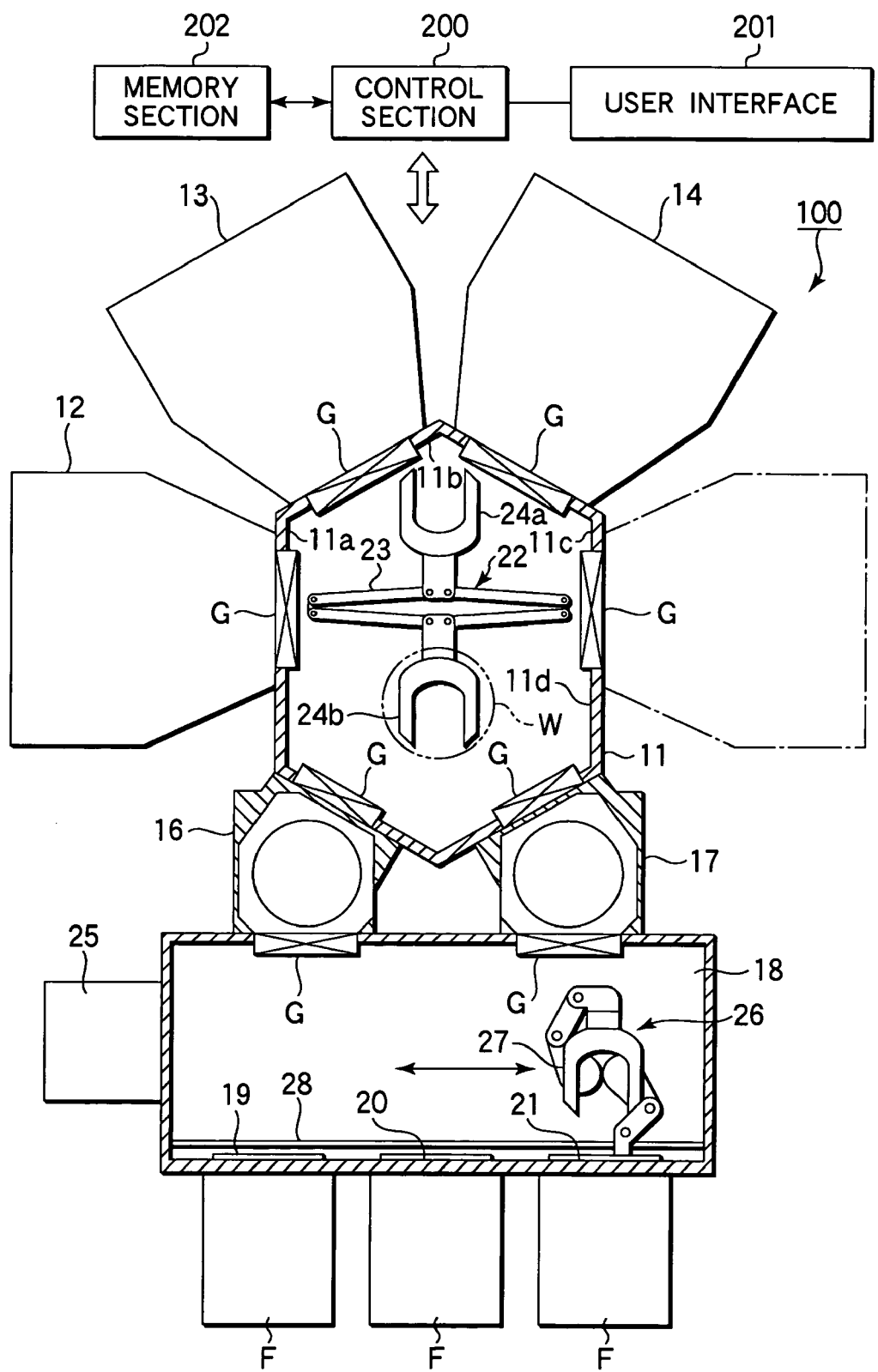
FIG. 2 is a structural view schematically showing an example of a film formation system of the multi-chamber type for performing a film formation method according to the present invention.

Embodiments of the present invention will now be described with reference to the accompanying drawings.

FIGS. 1A to 1D are process views for explaining a method for forming a Ti film and a TiN film according to an embodiment of the present invention.

As shown in FIG. 1A, a metal silicide film, such as a nickel silicide (NiSi) film 2, is disposed on a semiconductor substrate, such as an Si substrate 1. An inter-level insulating film 3 is disposed on the nickel silicide film 2, and is provided with a contact hole 4 formed therein and reaching the nickel silicide film 2. In this state, at first, the surface of the nickel silicide film 2 is cleaned by removing natural oxide films, which are very thin, and so forth present thereon to obtain an active and clean surface (stage 1). This operation improves the reactivity between the nickel silicide and Ti.

The cleaning process used at this time can be selected from various methods, such as (1) sputter etching by use of plasma, (2) a process mainly comprising a chemical reaction by use of an excited gas, and (3) a process utilizing a pure chemical reaction and thermal decomposition.

In the case of (1) described above, i.e., sputter etching by use of plasma, inductively coupled plasma is preferably used. The inductively coupled plasma has a high plasma density, while it brings about small attack of ions onto the underlayer, and thus the surface of the nickel silicide film 2 is less damaged. Further, where microwave plasma generated by an RLSA (Radial Line Slot Antenna), which has a lower electron temperature and a higher density, is used, it is possible to perform the cleaning process with even lower damage.

In the case of (2) described above, i.e., a process by use of an excited gas, since no plasma atmosphere is used, the nickel silicide film 2 is much less damaged. In this case, remote plasma is preferably used as a gas exciting source. Further, in the case of (3) described above, since only a pure chemical reaction and thermal decomposition are utilized, the nickel silicide film 2 is still less damaged.

Following the cleaning process in the stage 1, as shown in FIG. 1B, a Ti film 5 is formed to have a film thickness of not less than 2 nm but less than 10 nm on the clean surface of the nickel silicide film 2 by CVD using a Ti compound gas, such as $TiCl_4$. At this time, a reaction layer 6 of Ti with nickel silicide (NiSi) is formed to have a thickness of, e.g., 1 to 10 nm at the interface between the nickel silicide film 2 and Ti film 5 (stage 2). Then, as shown in FIG. 1C, a nitriding process using, e.g., $NH_3$ gas is performed on the Ti film 5 (stage 3).

Thereafter, as shown in FIG. 1D, a TiN film 7 is formed on the nitrided Ti film 5 by CVD using a Ti compound gas, such as $TiCl_4$ and a gas containing N and H, such as $NH_3$, (stage 4).

With the film formation stages described above, the nickel silicide film 2 serving as an underlayer is provided with a contact structure formed thereon, which comprises the reaction layer 6 of Ti with nickel silicide, and a TiN film having a two-layer structure with different concentrations, i.e., formed of the nitrided Ti film 5 and TiN film 7. Then, a film of Al, W, or Cu is formed on the TiN film 7 to embed a filler in the contact hole 4 and dispose a wiring layer, thereby establishing electrical contact (ohmic contact) with the Si substrate.

In the film formation stages described above, since the surface of the nickel silicide film 2 is cleaned by removing oxides formed thereon, as in the stage 1 described above, the surface comes to have high reactivity with Ti. Then, the Ti film 5 is formed on the surface, so that the reaction layer 6 of Ti with nickel silicide is uniformly formed at the interface between the nickel silicide film 2 and Ti film 5, and decreases the contact resistance there. Consequently, it is possible to decrease the contact resistance even where the film formation is performed at a low temperature of 500° C. or less.

If the Ti film 5 has a thickness of less than 2 nm, it may be difficult due to lack of Ti to uniformly form the reaction layer 6 at the interface between the nickel silicide film 2 and Ti film 5. In this case, the interface morphology is deteriorated, and the contact resistance is thereby increased. On the other hand, if the Ti film 5 has a thickness of 10 nm or more, the Ti film may be insufficiently nitrided in the stage 3 described above. In this case, film peeling easily occurs on the Ti film, particularly at the portion between the Ti film and inter-level insulating film 3. Accordingly, the Ti film 5 is formed to have a thickness of not less than 2 nm but less than 10 nm in the stage 2 described above. Within this range, the thickness of the Ti film is sufficient to form the reaction layer 6 at the contact portion while allowing the Ti film to be sufficiently nitrided. Consequently, it is possible to decrease the contact resistance and to suppress the film peeling.

In the stage 4 described above, film formation of the TiN film 7 is preferably arranged to alternately repeat, a plurality of times, a first step of supplying a Ti compound gas and a gas containing N and H, and a second step of stopping the Ti compound gas and supplying the gas containing N and H. By performing such alternate gas flows, the TiN film 7 formed in the first step is efficiently subjected to dechlorination by heat energy in the second step. In this case, even where the film formation is performed at a low temperature of 500° C. or less, the TiN film 7 is formed to have good film quality with little residual chlorine and a low resistivity, while suppressing occurrence of cracks. Consequently, it is possible to effectively prevent the TiN film 7 from causing film peeling. As the thickness of the TiN film 7 is smaller, the contact resistance is decreased more effectively. However, if the thickness is too small, the diffusion barrier property becomes insufficient against a wiring material, such as a metal. Accordingly, the thickness of the TiN film 7 is preferably set to be within a range of 3 to 50 nm, and more preferably of 5 to 20 nm. This range makes it possible to form the TiN film with a low contact resistance and a good barrier property against diffusion of the wiring material such as a metal.

As described above, according to this embodiment, the Ti film and TiN film are formed on the nickel silicide film 2. In this process, the surface of the nickel silicide film 2 serving as an underlayer is cleaned before the Ti film is formed. Further, the thickness of the Ti film is set to be not less than 2 nm but less than 10 nm, so that a reaction layer is suitably formed from the Ti film and underlayer, and the Ti film can be sufficiently nitrided. Consequently, even where the film formation is performed at a low temperature of 500° C. or less, it is possible to decrease the contact resistance and to prevent the film peeling. Since the problems described above due to low temperature film formation are solved, the film formation can be performed at a low temperature to maintain the nickel silicide film 2 in NiSi, which is a phase having a smaller resistivity, while forming very good contact, without causing the problems due to low temperature film formation. NiSi of a low resistivity phase generated under low temperature film formation has a state in which Ni and Si are combined one to one, wherein the Si is derived from an impurity diffusion layer of an Si substrate. In this case, for example, as compared with a cobalt silicide ($CoSi_2$) film in which Co and Si are always combined one to two, Si consumption from an impurity diffusion layer is lower, and thus problems due to a decrease in the area of the impurity diffusion layer are less likely caused. This is advantageous in providing a better contact property. Accordingly, the contact structure according to this embodiment, which is prepared by low temperature film formation of forming a Ti/TiN film on a nickel silicide film serving as an underlayer, is a promising contact structure for the next generation.

Next, an explanation will be given of a specific apparatus structure for performing the stages 1 to 4 described above according to this embodiment. FIG. 2 is a structural view schematically showing an example of a film formation system of the multi-chamber type for performing the stages 1 to 4 described above according to this embodiment.

As shown in FIG. 2, this film formation system 100 includes a wafer transfer chamber 11 with a hexagonal shape to transfer semiconductor substrates or Si wafers (which will be simply referred to as wafers). Four sides of the wafer transfer chamber 11 respectively have connection ports 11a, 11b, 11c, and 11d formed therein for respectively connecting predetermined processing apparatuses. The connection port 11a is connected to a plasma cleaning apparatus 12 for performing the cleaning process of the stage 1 as described above. The connection port 11b is connected to a Ti film formation apparatus 13 for performing the Ti film formation and Ti film nitriding process of the stages 2 and 3 as described above. The connection port 11c is connected to a TiN film formation apparatus 14 for performing the TiN film formation of the stage 4 as described above. The connection port 11d is connected to no processing apparatus, but may be connected to a suitable processing apparatus, as needed. The other two sides of the wafer transfer chamber 11 are respectively connected to load-lock chambers 16 and 17. A wafer I/O (in/out) chamber 18 is connected to the load-lock chambers 16 and 17 on the side reverse to the wafer transfer chamber 11. The wafer I/O chamber 18 has three ports 19, 20, and 21 on the side reverse to the load-lock chambers 16 and 17, wherein the ports are used for respectively connecting three FOUPs F that contain wafers W.

The plasma cleaning apparatus 12, Ti film formation apparatus 13, TiN film formation apparatus 14, and load-lock chambers 16 and 17 are connected to the wafer transfer chamber 11 respectively through gate valves G, as shown in FIG. 2. Each process chamber communicates with the wafer transfer chamber 11 when the corresponding gate valve G is opened, and is blocked from the wafer transfer chamber 11 when the corresponding gate valve G is closed. Gate valves G are also disposed between the load-lock chambers 16 and 17 and the wafer I/O chamber 18. Each of the load-lock chambers 16 and 17 communicates with the wafer I/O chamber 18 when the corresponding gate valve G is opened, and is blocked from the wafer I/O chamber 18 when the corresponding gate valve G is closed.

The wafer transfer chamber 11 is provided with a wafer transfer unit 22 disposed therein, for transferring wafers W to and from the plasma cleaning apparatus 12, Ti film formation apparatus 13, TiN film formation apparatus 14, and load-lock chambers 16 and 17. The wafer transfer unit 22 is disposed at the essential center of the wafer transfer chamber 11, and includes two blades 24a and 24b each for supporting a wafer W, respectively at the distal ends of two rotation-stretch portions 23, which are rotatable and extensible/contractible. The two blades 24a and 24b are connected to the rotation-stretch portions 23 to face opposite directions. The interior of the wafer transfer chamber 11 can be set at a predetermined vacuum level by a vacuum pump (not shown). Further, the vacuum level inside the wafer transfer chamber 11 is set to be higher when a wafer is transferred between the wafer transfer chamber 11 and each of the processing apparatuses 12, 13, and 14, so that the atmosphere inside the process chamber does not enter the wafer transfer chamber.

The wafer I/O chamber 18 is provided with a HEPA filter (not shown) disposed on the ceiling, and clean air is supplied through the HEPA filter into the wafer I/O chamber 18 in a down flow state. A wafer W is transferred into and from the wafer I/O chamber 18 within a clean air atmosphere under atmospheric pressure. Each of the three ports 19, 20, and 21 of the wafer I/O chamber 18 for connecting a FOUP F is provided with a shutter (not shown). A FOUP, which contains wafers W or is empty, is directly connected to each of the ports 19, 20, and 21, and the shutter is then opened to communicate the FOUP F with the wafer I/O chamber 18 while preventing inflow of outside air. An alignment chamber 15 for performing alignment of a wafer W is disposed on one side of the wafer I/O chamber 18.

The wafer I/O chamber 18 is provided with a wafer transfer unit 26 disposed therein, for transferring wafers W to and from the FOUPs F and load-lock chambers 16 and 17. The wafer transfer unit 26 includes articulated arm structures respectively having hands 27 at the distal ends. The wafer transfer unit 26 is movable on a rail 28 along a direction in which the FOUPs F are arrayed, to transfer a wafer W placed on each of the hands 27 at the distal ends.

The plasma cleaning apparatus 12, Ti film formation apparatus 13, TiN film formation apparatus 14, wafer transfer units 22 and 26, and other components are connected to and controlled by a control section 200 formed of a computer. The control section 200 is connected to a user interface 201 including, e.g., a keyboard and a display, wherein the keyboard is used for a process operator to input commands for operating the film formation system 100, and the display is used for showing visualized images of the operational status of the film formation system 100. Further, the control section 2.00 is connected to a memory section 202 that stores control programs for the control section 200 to control the film formation system 100 so as to perform various processes, and programs or recipes for respective components of the film formation system 100 to perform processes in accordance with process conditions. Recipes may be stored in a hard disk or semiconductor memory, or stored in a portable storage medium, such as a CDROM or DVD, to be attached to a predetermined position in the memory section 202. Further, recipes may be transmitted from another apparatus through, e.g., a dedicated line, as needed. A required recipe is retrieved from the storage section 202 and executed by the control section 200 in accordance with an instruction or the like through the user interface 201. Consequently, the film formation system 100 can perform a predetermined process under the control of the control section 200. The respective components may be directly controlled by the control section 200, or they may be provided with individual controllers and controlled through the controllers by the control section 200.

According to the film formation system 100 described above, a wafer W is picked up from one of the FOUPs F by the wafer transfer unit 26 disposed in the wafer I/O chamber 18. At this time, the interior of the wafer I/O chamber 18 is set at a clean air atmosphere under atmospheric pressure. Then, the wafer W is transferred into the alignment chamber 25, which performs alignment of the wafer W. Then, the wafer W is transferred into one of the load-lock chambers 16 and 17. After the load-lock chamber is vacuum-exhausted, the wafer is taken out of this load-lock chamber by the wafer transfer unit 22 disposed in the wafer transfer chamber 11. The wafer W is then transferred into the plasma cleaning apparatus 12 to remove natural oxide films from the surface of an NiSi film. Then, the wafer W is transferred into the Ti film formation apparatus 13 to perform the Ti film formation. Then, the wafer W with a Ti film formed thereon is transferred into the TiN film formation apparatus 14 to perform the TiN film formation. Thus, the film formation system 100 performs the cleaning process of the nickel silicide film, the Ti film formation, and the TiN film formation, in situ without opening to atmosphere the vacuum. After the film formation, the wafer W is transferred into one of the load-lock chambers 16 and 17 by the wafer transfer unit 22. After the interior of the load-lock chamber is returned to atmospheric pressure, the wafer is transferred from this load-lock chamber into one of the FOUPs F by the wafer transfer unit 26 disposed in the wafer I/O chamber 18. The operation described above is conducted for each wafer W of one lot, thereby completing the one lot process.

Next, a detailed explanation will be given of the plasma cleaning apparatus 12 described above.

Figure 3:
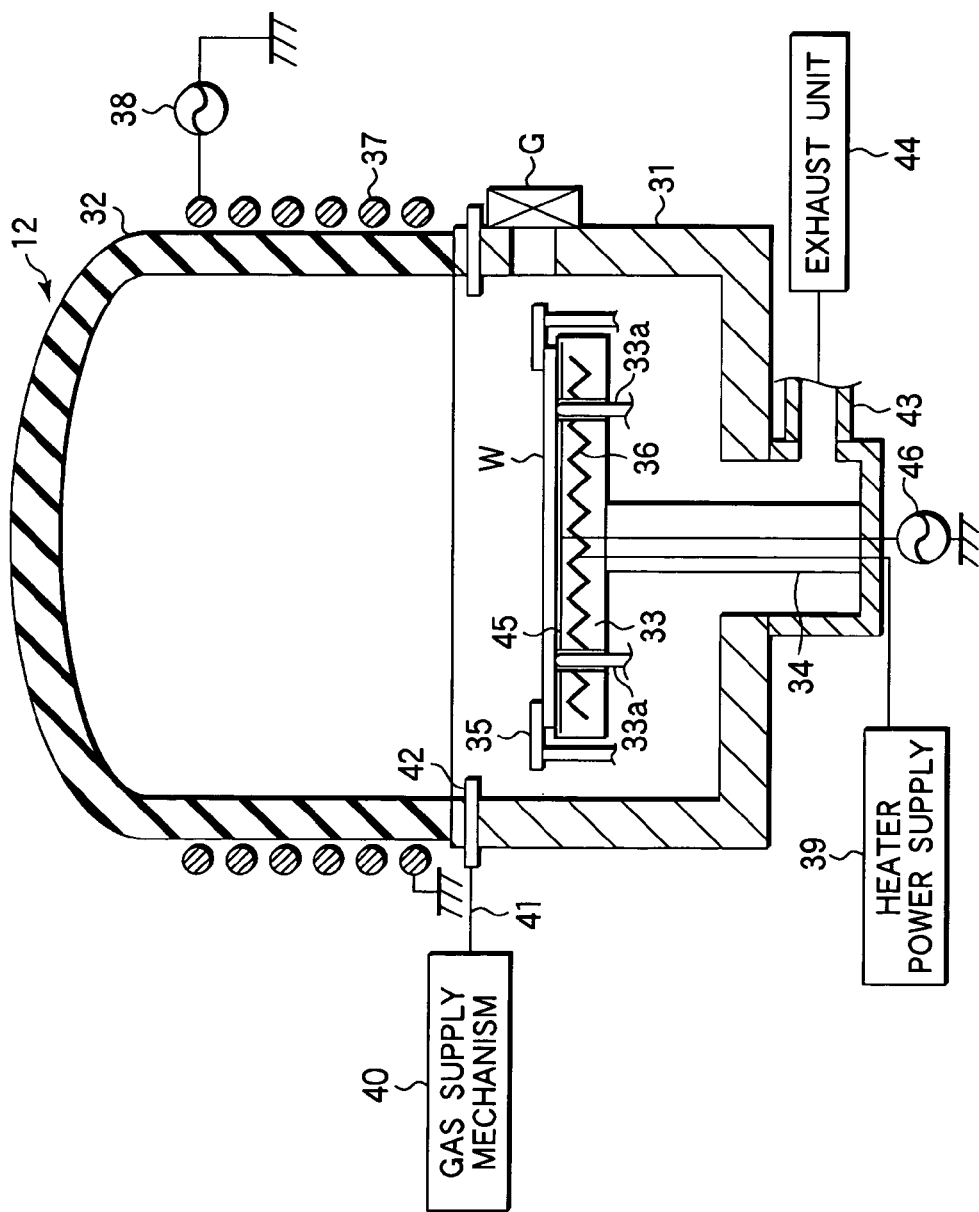
FIG. 3 is a sectional view showing a plasma cleaning apparatus installed in the film formation system shown in FIG. 1.

The plasma cleaning apparatus 12 is an apparatus of the inductively coupled plasma (ICP) type, which is used for performing sputter etching to clean the surface of a nickel silicide film serving as an underlayer. As shown in FIG. 3, the apparatus 12 includes an essentially cylindrical chamber 31, and an essentially cylindrical bell jar 32 continuously disposed on top of the chamber 31. The chamber 31 is provided with a susceptor 33 disposed therein and made of a ceramic, such as AlN, for supporting a target object or wafer W in a horizontal state. The susceptor 33 is supported by a cylindrical support member 34. A clamp ring 35 for clamping the wafer W is disposed around the edge of the susceptor 33. The susceptor 33 is provided with a heater 36 embedded therein, for heating the wafer W. The heater 36 is supplied with a power from a power supply 39 to heat the target object or wafer W to a predetermined temperature. Further, the susceptor 33 is provided with three wafer support pins 33a (only two of them are shown) that can project and retreat relative to the surface of the susceptor 33 to support the wafer W and move it up and down. The wafer support pins 33a are moved by an elevating mechanism having the same structure as that of the elevating mechanism of the Ti film formation apparatus described later.

The bell jar 32 is made of an electrically insulating material, such as quartz or ceramic. A coil 37 used as an antenna member is wound around the bell jar 32. The coil 37 is connected to an RF (Radio Frequency) power supply 38. The RF power supply 38 is set to have a frequency of 300 kHz to 60 MHz, and preferably of 450 kHz. An RF power is applied from the RF power supply 38 to the coil 37, so that an inductive electromagnetic field is formed in the bell jar 32.

A gas supply mechanism 40 is arranged to supply a process gas into the chamber 31. The gas supply mechanism 40 includes gas supply sources of predetermined gases, lines extending from the gas supply sources, switching valves, and mass-flow controllers for controlling flow rates (all of them are not shown). A gas introducing nozzle 42 is disposed in the sidewall of the chamber 31. The gas introducing nozzle 42 is connected to the gas supply mechanism 40 described above through a line 41, so that predetermined gases are supplied into the chamber 31 through the gas introducing nozzle 42.

Examples of the process gases are Ar, Ne, and He, each of which may be solely used. $H_2$ may be used along with any one of Ar, Ne, and He, or $NF_3$ may be used along with any one of Ar, Ne, and He. Of them, Ar alone is a preferable example used in this embodiment.

An exhaust line 43 is connected to the bottom of the chamber 31. The exhaust line 43 is connected to an exhaust unit 44 including a vacuum pump. The exhaust unit 44 is operated to decrease the pressure inside the chamber 31 and bell jar 32 to a predetermined vacuum level.

A gate valve G is disposed on the sidewall of the chamber 31 and the chamber 31 is connected to the wafer transfer chamber 11 through the gate valve G, as described above.

Further, the susceptor 33 is provided with an electrode 45 embedded therein and formed of molybdenum wires woven into a mesh shape. The electrode 45 is connected to an RF power supply 46 of, e.g., 13.56 MHz for supplying a bias.

According to the plasma cleaning apparatus 12 described above, a wafer W is transferred into the chamber 31 through the gate valve G in an opened state, and is received by the wafer support pins 33a located at the upper position. Then, the gate valve G is closed, and the interior of the chamber 31 and bell jar 32 is exhausted to a predetermined vacuum level by the exhaust unit 44. Further, the wafer W is heated to, e.g., 200° C. by the heater 36. Then, first Ar gas is supplied at a flow rate of, e.g., 0.5 L/min from the gas supply mechanism 40 through the gas introducing nozzle 42 into the chamber 31. At this time, the pressure inside the chamber 31 is set at, e.g., 10 Pa. While this state being maintained, second Ar gas is supplied at a flow rate of, e.g., 0.0035 L/min into the chamber 31. After this state is maintained for, e.g., 5 seconds, an RF power is applied from the RF power supply 38 to the coil 37 to form an inductive electromagnetic field within the bell jar 32, so as to generate inductively coupled plasma under a high pressure. At this time, the RF power supply 38 is preferably set at a power of 200 to 2,000 W, such as about 1,100 W. This state is maintained for, e.g., 10 seconds to stabilize plasma, and then the wafer support pins 33a are moved down, so that the wafer W is placed on the susceptor 33 and clamped by the clamp ring 35. Then, the flow rate of Ar gas is gradually decreased, and the pressure inside the chamber is set at a low pressure of, e.g., 0.066 Pa. The eventual flow rate of Ar gas is preferably set to be 0.001 to 0.05 L/min, such as 0.0035 L/min, to gradually stabilize plasma. With this state, the wafer is not etched. When the flow rate of Ar gas becomes stable, an RF power preferably set to be 50 to 1,500 W, such as about 800 W, is applied from the RF power supply 46 to the electrode 45 of the susceptor 33. With this bias voltage applied to the wafer W, Ar ions are attracted to the wafer W and etch the wafer surface.

The inductively coupled plasma thus acts on the wafer W, and performs Ar sputter etching to remove natural oxide films and so forth present on the surface of the NiSi film disposed on the Si substrate, thereby cleaning the surface. Consequently, the surface of the NiSi film thus cleaned can easily react with Ti. In this case, since the inductively coupled plasma has a high density, it can efficiently remove the natural oxide films, utilizing a relatively low amount of energy, which allows the NiSi film serving as an underlayer to be less damaged as low as possible.

Next, a detailed explanation will be given of the Ti film formation apparatus 13 for performing the Ti film formation and Ti film nitriding process of the stages 2 and 3 as described above.

Figure 4:
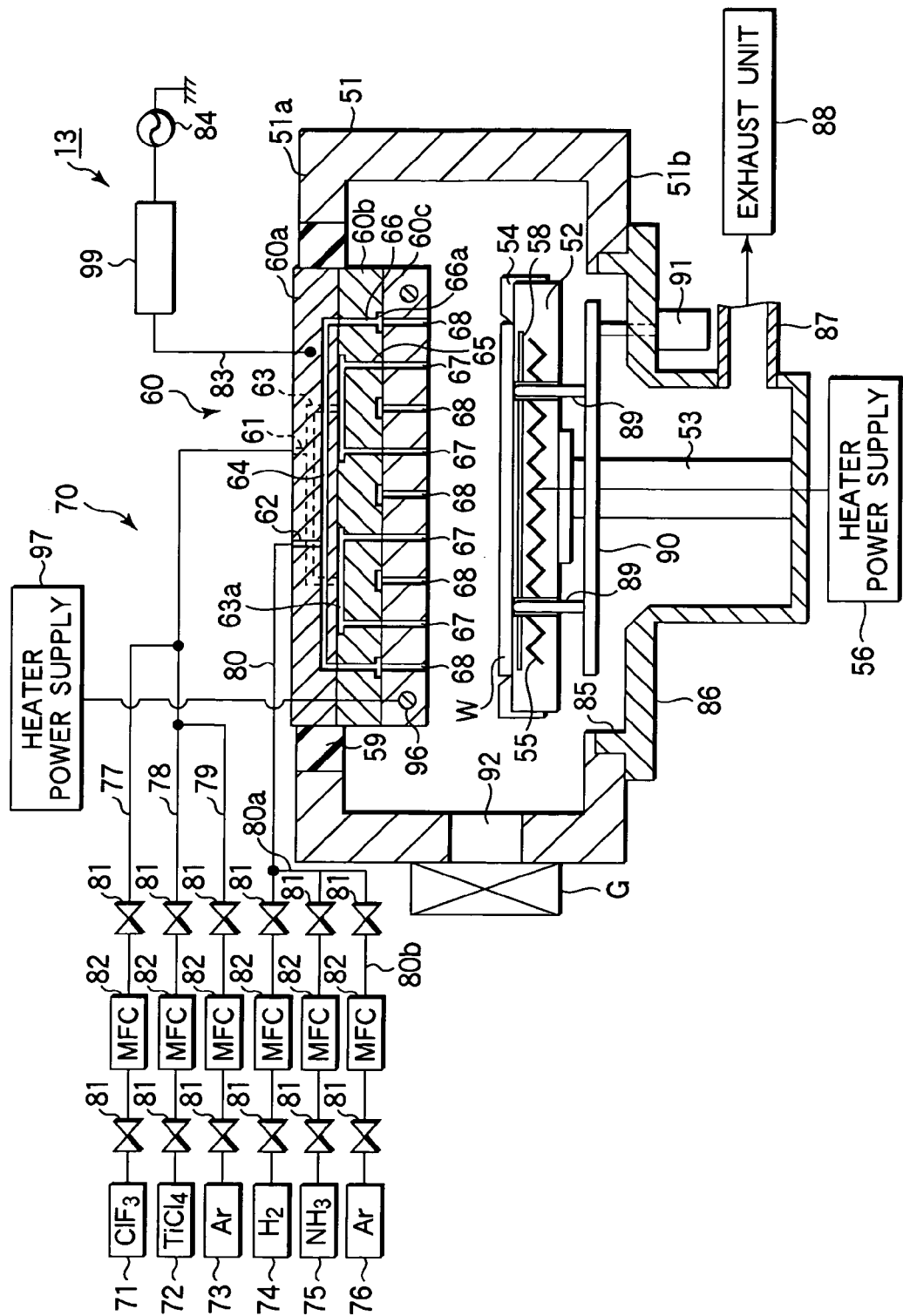
FIG. 4 is a sectional view showing a Ti film formation apparatus installed in the film formation system shown in FIG. 1.

FIG. 4 is a sectional view showing the Ti film formation apparatus 13. The Ti film formation apparatus 13 is an apparatus than can perform plasma CVD to form a Ti film. The Ti film formation apparatus 13 includes an essentially cylindrical airtight chamber 51. The chamber 51 is provided with a susceptor 52 disposed therein for supporting a wafer W in a horizontal state. The susceptor 52 is supported by a cylindrical support member 53 disposed below at the center. The susceptor 52 is made of a ceramic, such as AlN, and has a guide ring 54 disposed on the edge for guiding the wafer W. The susceptor 52 is provided with a heater 55 embedded therein. The heater 55 is supplied with a power from a heater power supply 56 to heat the wafer W to a predetermined temperature. Further, the susceptor 52 is provided with an electrode 58 embedded therein above the heater 55 and used as a lower electrode.

A showerhead 60 is disposed on the ceiling 51a of the chamber 51 through an insulating member 59. The showerhead 60 is formed of an upper block body 60a, a middle block body 60b, and a lower block body 60c. The lower block body 60c is provided with a ring heater 96 embedded therein near the outer edge. The heater 96 is supplied with a power from a power supply 97 to heat the showerhead 60 to a predetermined temperature.

Delivery holes 67 and 68 for discharging gases are alternately formed in the lower block body 60c. On the other hand, a first gas introducing port 61 and a second gas introducing port 62 are formed in the upper surface of the upper block body 60a. The first gas introducing port 61 is divided into a number of gas passages 63 in the upper block body 60a. The middle block body 60b has gas passages 65 formed therein, and the gas passages 63 communicate with the gas passages 65 through communication passages 63a extending horizontally. The gas passages 65 communicate with the delivery holes 67 formed in the lower block body 60c. The second gas introducing port 62 is divided into a number of gas passages 64 in the upper block body 60a. The middle block body 60b has gas passages 66 formed therein, which communicate with the gas passages 64. The gas passages 66 are connected to communication passages 66a extending horizontally in the middle block body 60b. The communication passages 66a communicate with a number of delivery holes 68 formed in the lower block body 60c. The first and second gas introducing ports 61 and 62 are respectively connected to gas lines 78 and 80 from a gas supply mechanism 70 described later.

The gas supply mechanism 70 includes a $ClF_3$ gas supply source 71 for supplying $ClF_3$ gas used as a cleaning gas; a $TiCl_4$ gas supply source 72 for supplying $TiCl_4$ gas used as a Ti compound gas; a first Ar gas supply source 73 for supplying Ar gas; an $H_2$ gas supply source 74 for supplying $H_2$ gas used as a reducing gas; an $NH_3$ gas supply source 75 for supplying $NH_3$ gas used as a nitriding gas; and a second Ar gas supply source 76 for supplying Ar gas. The $ClF_3$ gas supply source 71 is connected to a $ClF_3$ gas supply line 77. The $TiCl_4$ gas supply source 72 is connected to a $TiCl_4$ gas supply line 78. The first Ar gas supply source 73 is connected to a first Ar gas supply line 79. The $H_2$ gas supply source 74 is connected to an $H_2$ gas supply line 80. The $NH_3$ gas supply source 75 is connected to an $NH_3$ gas supply line 80a. The second Ar gas supply source 76 is connected to a second Ar gas supply line 80b. The gas supply mechanism 70 also includes an $N_2$ gas supply source (not shown). Each of the gas supply lines is provided with a mass-flow controller 82 and two valves 81 one on either side of the controller 82.

The first gas introducing port 61 is connected to the $TiCl_4$ gas supply line 78 extending from the $TiCl_4$ gas supply source 72. The $TiCl_4$ gas supply line 78 is connected to the $ClF_3$ gas supply line 77 extending from the $ClF_3$ gas supply source 71, and is also connected to the first Ar gas supply line 79 extending from the first Ar gas supply source 73. The second gas introducing port 62 is connected to the $H_2$ gas supply line 80 extending from the $H_2$ gas supply source 74. The $H_2$ gas supply line 80 is connected to the $NH_3$ gas supply line 80a extending from the $NH_3$ gas supply source 75, and is also connected to the second Ar gas supply line 80b extending from the second Ar gas supply source 76. According to this arrangement, during a process, $TiCl_4$ gas from the $TiCl_4$ gas supply source 72 and Ar gas from the first Ar gas supply source 73 are supplied into the $TiCl_4$ gas supply line 78. This mixture gas flows through the first gas introducing port 61 of the showerhead 60 into the showerhead 60, and is then guided through the gas passages 63 and 65 and discharged into the chamber 51 through the delivery holes 67. On the other hand, $H_2$ gas from the $H_2$ gas supply source 74 and Ar gas from the second Ar gas supply source 76 are supplied into the $H_2$ gas supply line 80. This mixture gas flows through the second gas introducing port 62 of the showerhead 60 into the showerhead 60, and is then guided through the gas passages 64 and 66 and discharged into the chamber 51 through the delivery holes 68. In other words, the showerhead 60 is of the post-mix type in which $TiCl_4$ gas and $H_2$ gas are supplied into the chamber 51 separately from each other. $TiCl_4$ gas and $H_2$ gas react with each other after they are discharged and mixed.

The showerhead 60 is connected to an RF power supply 84 through a matching unit 99. During film formation, an RF power of, e.g., 450 kHz is applied from the RF power supply 84 to the showerhead 60, so that an RF electric field is generated between the showerhead 60 and electrode 58. Due to the presence of the RF electric field, a film formation gas supplied into the chamber 51 is turned into plasma, which is used for the Ti film formation.

The bottom wall 51b of the chamber 51 has a circular opening 85 formed at the center. An exhaust chamber 86 is formed at the bottom wall 51b to cover the opening 85 and extend downward. An exhaust unit 88 is connected to one side of the exhaust chamber 86 through the exhaust line 87. The exhaust unit 88 can be operated to decrease the pressure of the chamber 51 to a predetermined vacuum level.

The susceptor 52 is provided with three (only two of them are shown) wafer support pins 89 for supporting the wafer W and moving it up and down. The wafer support pins 89 are fixed on a support plate 90 and can project and retreat relative to the surface of the susceptor 52. The wafer support pins 89 are moved up and down with the support plate 90 by a drive mechanism 91, such as an air cylinder.

The chamber 51 has a transfer port 92 formed in the sidewall, for transferring the wafer W to and from the wafer transfer chamber 11, and a gate valve G for opening/closing the transfer port 92.

In the apparatus described above, the Ti film formation and Ti film nitriding process of the stages 2 and 3 are performed, as follows. At first, the interior of the chamber 51 is exhausted to a predetermined vacuum level by the exhaust unit 88. Further, the susceptor 52 is heated to a predetermined temperature by the heater 55. The showerhead 60 is heated to a predetermined temperature by the heater 96.

In this state, an RF power is applied from the RF power supply 84 to the showerhead 60. At the same time, $TiCl_4$ gas and Ar gas are supplied from the $TiCl_4$ gas supply source 72 and first Ar gas supply source 73 to the first gas introducing port 61, and discharged through the gas delivery holes 67. Further, $H_2$ gas and Ar gas are supplied from the $H_2$ gas supply source 74 and second Ar gas supply source 76 to the second gas introducing port 62, and discharged through the gas delivery holes 68. With these operations, the gases are turned into plasma within the chamber 51, and a pre-coating process is performed on the members within the chamber 51, such as the inner wall of the chamber 51 and the showerhead 60. At this time, $TiCl_4$ gas is set at a flow rate of 0.001 to 0.02 L/min, $H_2$ gas at a flow rate of 1.5 to 4 L/min, and Ar gas at a flow rate of 0.3 to 1.6 L/min, approximately. Consequently, when the Ti film formation is performed on the wafer W, the temperature of the wafer W can be changed at an almost constant rate.

When the pre-coating process is finished, the supply of $TiCl_4$ gas and $H_2$ gas is stopped and the RF power application from the RF power supply 84 to the showerhead 60 is also stopped. Further, while Ar gas and $N_2$ gas are supplied from the first and second Ar gas supply sources 73 and 76 and the $N_2$ gas supply source through the showerhead 60 into the chamber 51 at gradually increased flow rates (ramp-up), the interior of the chamber 51 is pre-heated by the heater 55. After this pre-heating is performed for, e.g., 15 seconds, the supply of Ar gas and $N_2$ gas is stopped, and the interior of the chamber 51 is quickly vacuum-exhausted by the exhaust unit 88 at full load. In this state, the gate valve G is opened, and a wafer W is transferred from the wafer transfer chamber 11 in a vacuum state through the transfer port 92 into the chamber 51, and is placed on the susceptor 52.

Thereafter, Ar gas and $H_2$ gas are supplied from the first and second Ar gas supply sources 73 and 76 and the $H_2$ gas supply source through the showerhead 60 into the chamber 51 at gradually increased flow rates (ramp-up), until the interior of the chamber 51 reaches a predetermined pressure. This operation is intended to gradually increase the gas pressure inside the chamber 51, thereby preventing the wafer W from being warped. The range of flow rate of Ar gas is preferably set to be 0.3 to 3 L/min. The range of flow rate of $H_2$ gas is preferably set to be 1.5 to 6 L/min. This state is maintained for a predetermined time to perform pre-heating of the wafer W. This pre-heating is performed for, e.g., 14 seconds. Further, at this time, the pressure is preferably set to be 260 to 1,333 Pa, such as 667 Pa.

After the pre-heating of the wafer W is finished, $TiCl_4$ gas is supplied at a flow rate preferably of 0.001 to 0.02 L/min to perform pre-flowing, while the flow rates of Ar gas and $H_2$ gas supplied from the first and second Ar gas supply sources 73 and 76 and the $H_2$ gas supply source 74 are maintained. This pre-flowing is performed for, e.g., 15 seconds.

Then, prior to the film formation, an RF power is applied from the RF power supply 84 to the showerhead 60 to generate plasma within the chamber 51 (pre-plasma). At this time, the RF power supply 84 is preferably set at a power of 300 to 2,000 W, such as 800 W.

Then, while the gas flow rates, pressure, and RF power are maintained, the flow of $TiCl_4$ gas is switched toward the chamber 51. Consequently, plasma of Ar gas, $N_2$ gas, and $TiCl_4$ gas is generated, so that a Ti film is formed to have a predetermined thickness.

In the Ti film formation, the wafer W is heated at a temperature preferably of 300 to 500° C., such as about 450° C., to prevent the nickel silicide film serving as an underlayer from causing phase transition to a higher resistivity phase. Further, the showerhead 60 is heated to 450 to 500° C.

In this case, the Ti film is formed to have a film thickness of not less than 2 nm but less than 10 nm, so that a reaction layer of the Ti film with the nickel silicide film serving as an underlayer is preferably formed to decrease the contact resistance. Consequently, even where the film formation is performed at a low temperature of 500° C. or less, a low contact resistance is obtained.

After the Ti film formation, the supply of $TiCl_4$ gas is stopped and the power application from the RF power supply 84 to the showerhead 60 is also stopped. Further, while the other gases, i.e., Ar gas and $H_2$ gas, are supplied, a post process following the film formation is performed. This post process following the film formation is performed for, e.g., 2 seconds. Then, while the flow rate of $H_2$ gas is decreased and the flow rate of Ar gas flow rate is maintained, purging of the interior of the chamber 51 is performed, for, e.g., 4 seconds.

Thereafter, the Ti film thus formed is sequentially subjected to a nitriding process inside the same chamber. This nitriding process is performed as follows. Specifically, while the flow rates of Ar gas and $H_2$ gas are maintained, $NH_3$ gas is supplied for about 10 seconds at a flow rate preferably of 0.5 to 3 L/min, such as 1.5 L/min. Then, while the gas supply is maintained, an RF power is applied from the RF power supply 84 to the showerhead 60 to generate plasma of these gases. At this time, the RF power supply 84 is set at a power of 300 to 1,200 W, such as 800 W.

When a predetermined time has elapsed, the power application from the RF power supply 84 to the showerhead 60 is stopped, and the gas flow rates and vacuum level are gradually decreased to finish the Ti film formation and Ti film nitriding process.

As described above, the Ti film thickness is set to be not less than 2 nm but less than 10 nm, and the nitriding process is then performed thereon. Consequently, the Ti film is sufficiently nitrided, so that the Ti film is prevented from being etched in the subsequent TiN film formation, thereby suppressing the film peeling on the Ti film.

Next, a detailed explanation will be given of the TiN film formation apparatus 14 for performing the TiN film formation of the stage 4, following the Ti film nitriding process, as described above.

Figure 5:
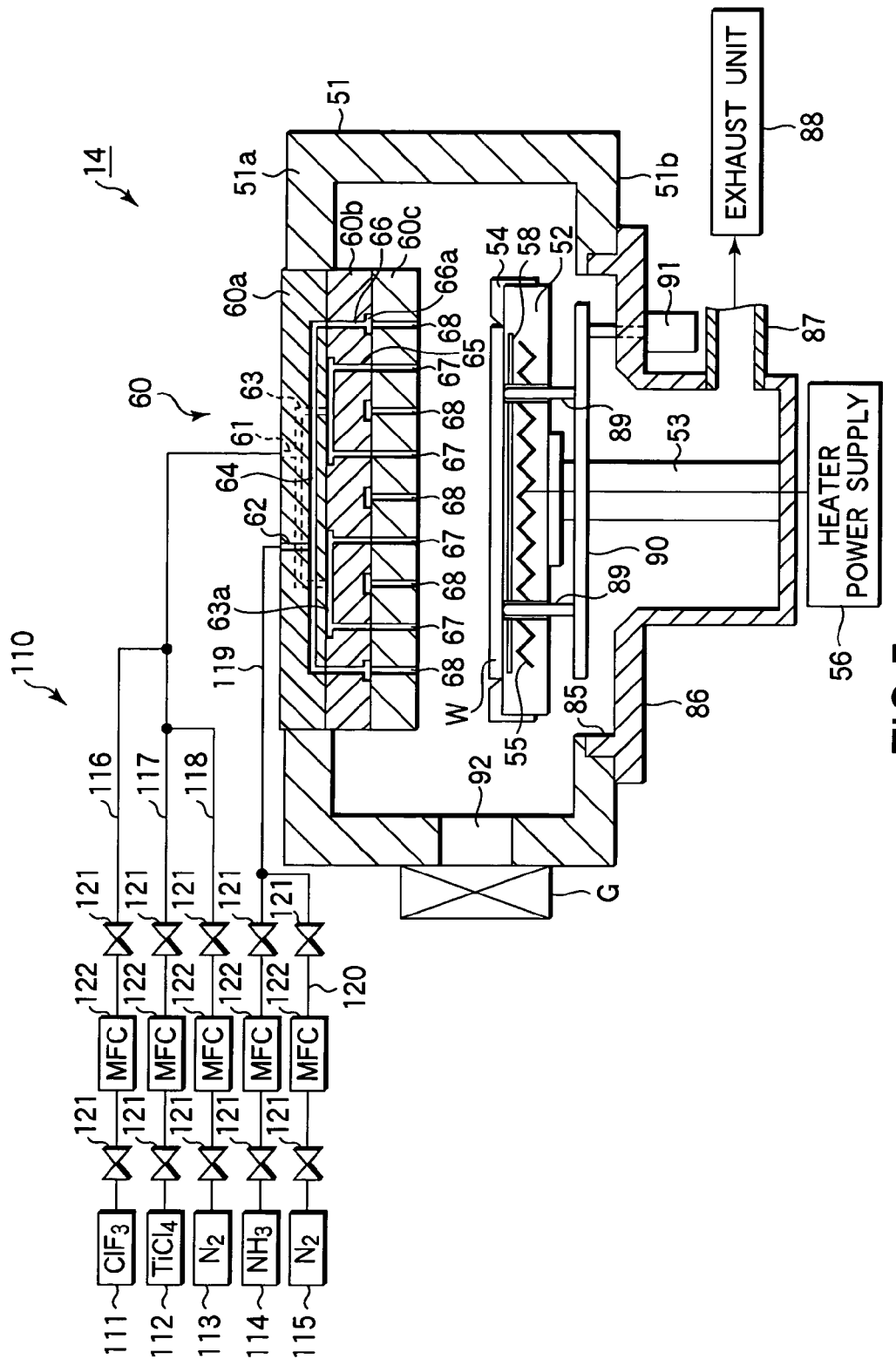
FIG. 5 is a sectional view showing a TiN film formation apparatus installed in the film formation system shown in FIG. 1.

FIG. 5 is a sectional view showing the TiN film formation apparatus 14. The TiN film formation apparatus 14 is an apparatus used for performing thermal CVD to form a TiN film. The TiN film formation apparatus 14 has almost the same structure as the Ti film formation apparatus 13, except that it includes no plasma generating means or showerhead heating means, and there are some differences in gases supplied from the gas supply mechanism. Accordingly, the same constituent elements of this apparatus as those in FIG. 4 are denoted by the same reference numerals, and their explanation will be omitted, except for the gas supply mechanism.

The gas supply mechanism 110 includes a $ClF_3$ gas supply source 111 for supplying $ClF_3$ gas used as a cleaning gas; a $TiCl_4$ gas supply source 112 for supplying $TiCl_4$ gas used as a Ti compound gas; a first $N_2$ gas supply source 113 for supplying $N_2$ gas; an $NH_3$ gas supply source 114 for supplying $NH_3$ gas used as a nitriding gas; and a second $N_2$ gas supply source 115 for supplying $N_2$ gas. The $ClF_3$ gas supply source 111 is connected to a $ClF_3$ gas supply line 116. The $TiCl_4$ gas supply source 112 is connected to a $TiCl_4$ gas supply line 117. The first $N_2$ gas supply source 113 is connected to a first $N_2$ gas supply line 118. The $NH_3$ gas supply source 114 is connected to an $NH_3$ gas supply line 119. The second $N_2$ gas supply source 115 is connected to a second $N_2$ gas supply line 120. Further, the gas supply mechanism 110 includes an Ar gas supply source (not shown). Each of the gas supply lines is provided with a mass-flow controller 122 and two valves 121 one on either side of the controller 122.

The first gas introducing port 61 of the showerhead 60 is connected to the $TiCl_4$ gas supply line 117 extending from the $TiCl_4$ gas supply source 112. The $TiCl_4$ gas supply line 117 is connected to the $ClF_3$ gas supply line 116 extending from the $ClF_3$ gas supply source 111, and is also connected to the first $N_2$ gas supply line 118 extending from the first $N_2$ gas supply source 113. The second gas introducing port 62 is connected to the $NH_3$ gas supply line 119 extending from the $NH_3$ gas supply source 114. The $NH_3$ gas supply line 119 is connected to the second $N_2$ gas supply line 120 extending from the second $N_2$ gas supply source 115. According to this arrangement, during a process, $TiCl_4$ gas from the $TiCl_4$ gas supply source 112 and $N_2$ gas from the first $N_2$ gas supply source 113 are supplied into the $TiCl_4$ gas supply line 117. This mixture gas flows through the first gas introducing port 61 of the showerhead 60 into the showerhead 60, and is then guided through the gas passages 63 and 65 and discharged into the chamber 51 through the delivery holes 67. On the other hand, $NH_3$ gas used as a nitriding gas from the $NH_3$ gas supply source 114 and $N_2$ gas from the second $N_2$ gas supply source 115 are supplied into the $NH_3$ gas supply line 119. This mixture gas flows through the second gas introducing port 62 of the showerhead 60 into the showerhead 60, and is then guided through the gas passages 64 and 66 and discharged into the chamber 51 through the delivery holes 68.

In the apparatus described above, the TiN film formation of the stage 4 is performed, as follows. At first, the interior of the chamber 51 is exhausted by the exhaust unit 88 at full load. In this state, while $N_2$ gas is supplied from the first and second $N_2$ gas supply source 113 and 115 through the showerhead 60 into the chamber 51, the interior of the chamber 51 is pre-heated by the heater 55. When the temperature becomes stable, $N_2$ gas, $NH_3$ gas, and $TiCl_4$ gas are supplied respectively from the first $N_2$ gas supply source 113, $NH_3$ gas supply source 114, and $TiCl_4$ gas supply source 112 at predetermined flow rates. In this state, pre-flowing is performed while the pressure inside the chamber is maintained at a predetermined value. Then, a TiN film pre-coating is formed on the surface of the members within the chamber 51, such as the inner wall of the chamber 51, the inner wall of the exhaust chamber 86, and the showerhead 60, while they are heated by the heater 55, and the gas flow rates and pressure are maintained. Consequently, when the TiN film formation is performed on the wafer W, the temperature of the wafer W can be changed at an almost constant rate.

When the pre-coating process is finished, the supply of $NH_3$ gas and $TiCl_4$ gas is stopped. Further, $N_2$ gas is supplied as a purge gas from the first and second $N_2$ gas supply sources 113 and 115 into the chamber 51 to purge the interior of the chamber 51. Then, as needed, $N_2$ gas and $NH_3$ gas are supplied to perform a nitriding process on the surface of the TiN thin film thus formed. Consequently, the TiN film is dechlorinated to decrease the residual chlorine in the film, and is thereby stabilized.

Thereafter, the interior of the chamber 51 is quickly vacuum-exhausted by the exhaust unit 88 at full load. In this state, the gate valve G is opened, and a wafer W is transferred by the wafer transfer unit 22 from the wafer transfer chamber 11 in a vacuum state through the transfer port 92 into the chamber 51, and is placed on the susceptor 52.

Thereafter, $N_2$ gas and $NH_3$ gas are supplied from the first and second $N_2$ gas supply sources 113 and 115 and the $NH_3$ gas supply source 114 through the showerhead 60 into the chamber 51 to gradually increase the pressure inside the chamber 51 to a predetermined pressure. The eventual flow rate of $N_2$ gas from each of the first and second $N_2$ gas supply sources 113 and 115 is preferably set to be 0.05 to 3 L/min. The eventual flow rate of $NH_3$ gas is preferably set to be 0.005 to 0.3 L/min. The pressure inside the chamber is set to be about 40 to 670 Pa. While this state is maintained for a predetermined time, pre-heating of the wafer W is performed at, e.g., 300 to 500° C. This pre-heating is performed for, e.g., 30 seconds. In this case, the wafer is heated while the flow rate of $NH_3$ gas is set such that the partial pressure thereof becomes lower than that of $N_2$ gas. This arrangement provides an incubation effect in a case, for example, where the underlayer film has been oxidized.

After the pre-heating of the wafer W is finished, $TiCl_4$ gas is supplied at a flow rate preferably of 0.01 to 0.08 L/min from the $TiCl_4$ gas supply source 112 to perform pre-flowing, while the flow rates of $N_2$ gas supplied from the first and second $N_2$ gas supply sources 113 and 115 are maintained. This pre-flowing is performed for, e.g., 15 seconds. Then, $N_2$ gas is supplied as a purge gas from the first and second $N_2$ gas supply sources 113 and 115 into the chamber 51 to purge the interior of the chamber 51 for, e.g., 6 seconds. At this time, the flow rate of $N_2$ gas from each of the first and second $N_2$ gas supply sources 113 and 115 is set at, e.g., 1 L/min. On the other hand, along with the purging of the interior of the chamber 51, $NH_3$ gas is supplied at a flow rate preferably of 0.01 to 0.08 L/min to perform pre-flowing.

Thereafter, the flow rate of $N_2$ gas is decreased to, e.g., 0.17 L/min, and then the TiN film formation is started when the gas flow rates become stable. At first, $TiCl_4$ gas and $NH_3$ gas are supplied into the chamber 51 while being carried by $N_2$ gas supplied from the first and second $N_2$ gas supply sources 113 and 115. At this time, the wafer W is heated by the heater 55, and thus a TiN film is formed by thermal CVD (first step). This first step is performed for, e.g., 16 seconds. Then, the supply of $TiCl_4$ gas and $NH_3$ gas is stopped. Further, $N_2$ gas is supplied as a purge gas at an increased flow rate of 1 L/min from each of the first and second $N_2$ gas supply sources 113 and 115 into the chamber 51 to purge the interior of the chamber 51. Then, $NH_3$ gas is supplied into the chamber 51 while being carried by $N_2$ gas supplied from the second $N_2$ gas supply source 115, to perform a second step of annealing and nitriding the TiN film by $N_2$ gas and $NH_3$ gas. This second step is performed for, e.g., 5 seconds.

One cycle defined by a period from the pre-flowing of $TiCl_4$ gas to the second step described above is repeated a plurality of times, and preferably three times or more, such as 12 to 24 times. The gas switching at this time is performed by valve switching under the control of the controller 123. Consequently, a TiN film is formed to have a predetermined thickness.

In the TiN film formation, the wafer W is heated to a temperature preferably of 300 to 500° C., such as about 450° C., to prevent the NiSi film serving as an underlayer from causing phase transition to a higher resistivity phase.

As described above, the first step and second step are alternately repeated to form a TiN film by alternate gas flows. Accordingly, the TiN film formed in the first step is efficiently subjected to dechlorination by annealing in the second step, so that the residual chlorine in the film is remarkably decreased. In this case, even where the film formation is performed at a low temperature, the TiN film is formed to have good film quality with little residual chlorine and a low resistivity. Consequently, it is possible to prevent the TiN film from generating cracks and to improve the adhesion degree relative to the Ti film, thereby effectively preventing film peeling of the TiN film. Further, the thickness of the TiN film is set to be within a range of 3 to 50 nm, and preferably of 5 to 20 nm. This range makes it possible to form a TiN film with a low contact resistance and a good barrier property.

As described above, a method for forming a Ti film and a TiN film according to the present invention can be performed by sequentially performing the stages 1 to 4, while using the plasma cleaning apparatus 12 for the cleaning process, Ti film formation apparatus 13, and TiN film formation 14.

The Ti film formation, nitriding process, and TiN film formation may be continuously performed in one Ti film formation apparatus 13 while switching gases and turning on/off plasma generation. In this case, the process can be efficiently performed. Further, in this case, no TiN film formation apparatus 14 is necessary.

Figure 6:
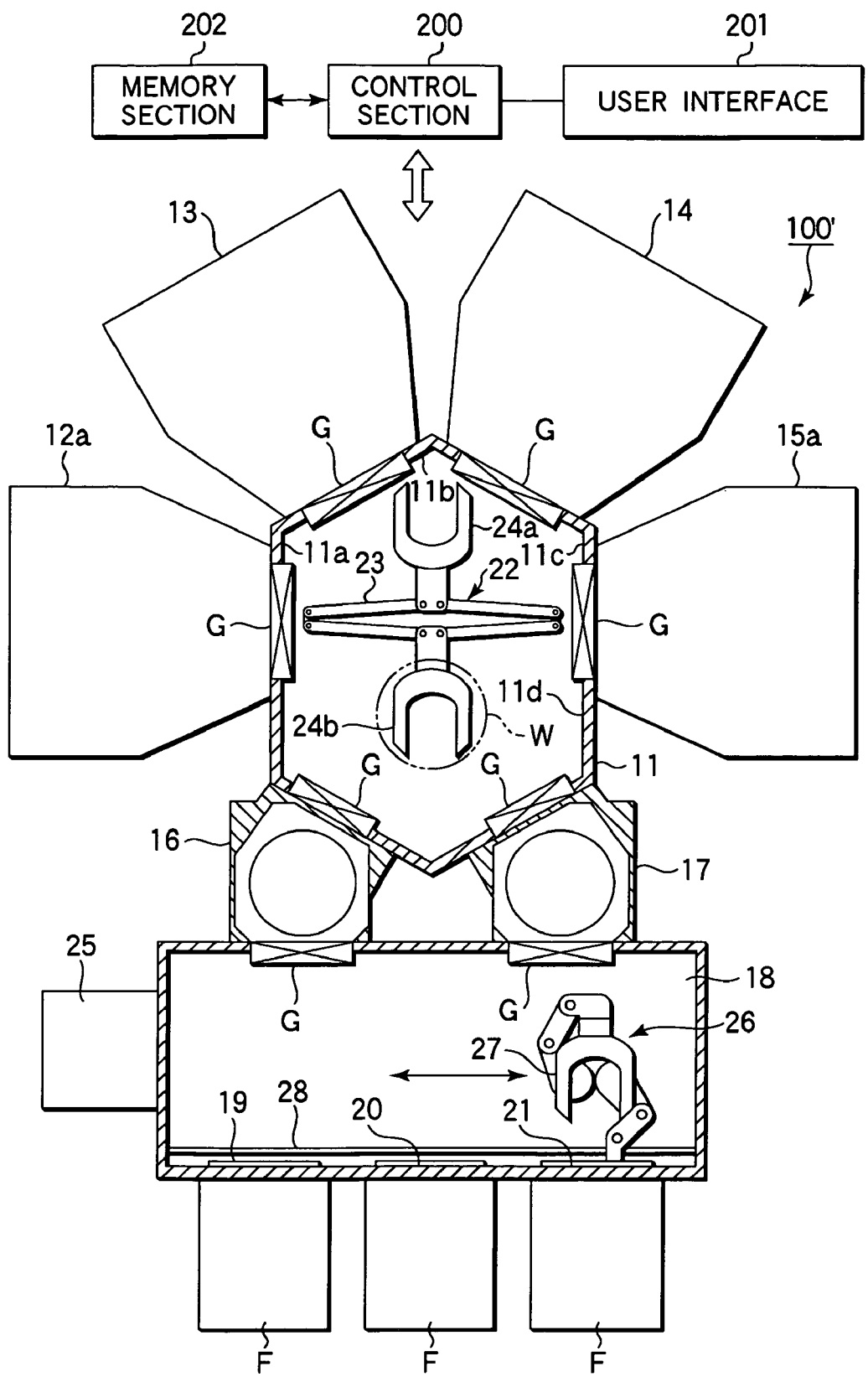
FIG. 6 is a structural view schematically showing an alternative example of a film formation system of the multi-chamber type for performing a film formation method according to the present invention.

Next, an explanation will be give of an alternative example of a film formation system. FIG. 6 is a structural view schematically showing an alternative example of a film formation system of the multi-chamber type.

As shown in FIG. 6, this film formation system 100' employs an excited gas cleaning apparatus 12a in place of the plasma cleaning apparatus 12 of the film formation system 100 for the cleaning process. Further, the film formation system 100' includes a heat processing apparatus 15a disposed at the connection port 11d, which is not connected to any processing apparatus in the film formation system 100. Otherwise, the film formation system 100' has basically the same structure as that of the film formation system 100 described above. Accordingly, the same constituent elements of this system as those of the film formation system 100 are denoted by the same reference numerals, and their explanation will be omitted. This film formation system 100' is operated to perform processes in the same manners as in the film formation system 100 except that the cleaning process is performed by the excited gas cleaning apparatus 12a and heat processing apparatus 15a.

Next, an explanation will be given of an example of the structure of the excited gas cleaning apparatus 12a.

Figure 7:
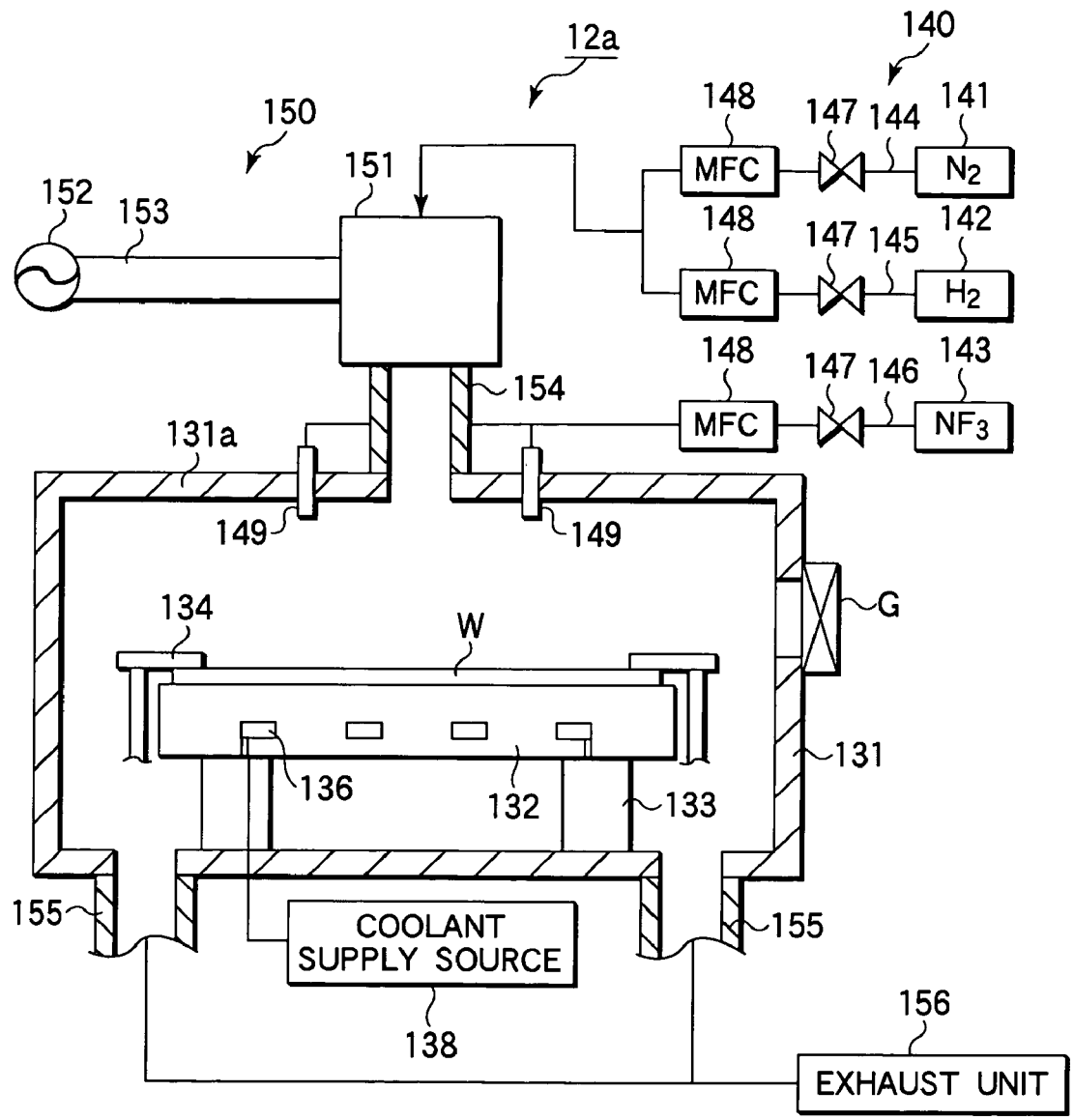
FIG. 7 is a sectional view showing an excited gas cleaning apparatus installed in the film formation system shown in FIG. 6.

FIG. 7 is a sectional view showing an example of the structure of the excited gas cleaning apparatus 12a. This excited gas cleaning apparatus 12a is arranged to perform a cleaning process mainly comprising a chemical reaction by use of an excited gas, which is generated by microwave remote plasma. The excited gas cleaning apparatus 12a includes an essentially cylindrical airtight chamber 131 for accommodating a wafer W, a gas supply mechanism 140 for supplying process gases into the chamber 131, and a plasma generation mechanism 150 for generating plasma by microwaves to excite the process gases.

The chamber 131 is provided with a susceptor 132 disposed therein for supporting a target object or wafer W in a horizontal state. The susceptor 132 is supported by a cylindrical support member 133. A clamp ring 134 for clamping the wafer W is disposed around the edge of the susceptor 132. The susceptor 132 is provided with a coolant passage 136 formed therein, in which a coolant is supplied from a coolant supply source 138. The coolant is caused to flow through the coolant passage 136 to control the temperature of the susceptor 132 and further the temperature of the wafer W to be, e.g., a normal temperature. The susceptor 132 may be provided with a heater embedded therein, depending on the coolant temperature and control temperature. Further, the susceptor 132 is provided with three wafer support pins (not shown) that can project and retreat relative to the surface of the susceptor 132 to support the wafer W and move it up and down. The wafer support pins are moved by an elevating mechanism having the same structure as that of the elevating mechanism of the Ti film formation apparatus 13 described above.

The gas supply mechanism 140 includes an N$_2$ supply source 141 for supplying N$_2$, an H$_2$ supply source 142 for supplying H$_2$, and an NF$_3$ supply source 143 for supplying NF$_3$, which are respectively connected to gas lines 144, 145, and 146. Each of the gas lines is provided with a valve 147 and a mass-flow controller 148.

The plasma generation mechanism 150 includes a plasma generation chamber 151 disposed above the chamber 131, a microwave generation power supply 152 for generating microwaves, and a waveguide tube 153 for guiding microwaves generated in the microwave generation power supply 152 to the plasma generation chamber 151. The plasma generation mechanism 150 further includes a plasma feed cylinder 154 for supplying plasma generated in the plasma generation chamber 151 into the chamber 130 through the ceiling 131a of the chamber 131.

In the gas supply mechanism 140, the gas line 144 extending from the N$_2$ supply source 141 and the gas line 145 extending from the H$_2$ supply source 142 are connected to the plasma generation chamber 151. N$_2$ gas and H$_2$ gas supplied through the gas lines 144 and 145 into the plasma generation chamber 151 are turned into plasma by microwaves guided from the microwave generation power supply 152 through the waveguide tube 153 into the plasma generation chamber 151. The plasma thus generated is supplied through the plasma feed cylinder 154 into the chamber 131. On the other hand, the gas line 146 extending from the NF$_3$ supply source 143 is connected to a plurality of gas introducing nozzles 149 inserted into the chamber 131 through the ceiling 131a of the chamber 131. Accordingly, NF$_3$ gas is supplied through the gas introducing nozzle 149 into the chamber. The gas introducing nozzle 149 may be arranged to discharge the gas like a shower.

An exhaust line 155 is connected to the bottom of the chamber 131. The exhaust line 155 is connected to an exhaust unit 156 including a vacuum pump. The exhaust unit 156 is operated to decrease the pressure inside the chamber 131 to a predetermined vacuum level.

A gate valve G is disposed on the sidewall of the chamber 131, and a wafer W is transferred between the chamber 131 and the adjacent transfer chamber 11 through the gate valve G in an opened state.

According to the excited gas cleaning apparatus 12a described above, the interior of the chamber 131 is exhausted to a predetermined vacuum pressure by the exhaust unit 156, and a predetermined gas is supplied. In this state, the gate valve G is opened, and a wafer W is transferred by the transfer unit 22 from the transfer chamber 11 in a vacuum state into the chamber 131. The wafer is placed on the susceptor 132 and clamped by the clamp ring 134. Then, the gate valve G is closed.

Then, N$_2$ and H$_2$ are supplied from the N$_2$ supply source 141 and H$_2$ supply source 142 into the plasma generation chamber 151. Further, microwaves are supplied from the microwave generation power supply 152 through the waveguide tube 153 into the plasma generation chamber 151. Consequently, the gases are turned into plasma to generate radicals, which are then supplied into the chamber. On the other hand, NF$_3$ is supplied from the NF$_3$ supply source 143 through the gas line 146 and gas introducing nozzle 149 into the chamber 131. The NF$_3$ gas thus supplied is excited by N$_2$ and H$_2$ radicals supplied into the chamber 131. The excited gas provides a chemical action on natural oxide films present on the surface of a nickel silicide film on the wafer W. Consequently, the following reaction proceeds to generate (NH$_4$)$_2$SiF$_6$, which is thermally decomposable.

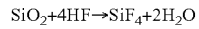

After this process, the gate valve G is opened, and the wafer W is unloaded by the transfer unit 22 into the transfer chamber 11. Then, the wafer W is transferred into the heat processing apparatus 15a and is subjected to a heat process. Consequently, the reaction component described above is decomposed and sublimated, and the natural oxide films are thereby removed.

The microwave remote plasma described above has a high energy and thus can cause the natural oxide films to be removed efficiently and essentially completely. Further, the excited gas described above mainly provides a chemical action on the natural oxide films, and thus can decrease physical damage to the nickel silicide film serving as an underlayer, as compared to the sputter etching by use of plasma described above.

The excited gas cleaning apparatus 12a employs the following process conditions, for example. The process pressure is set to be 0.133 to 133 Pa, and preferably to be 0.133 to 26.6 Pa. The wafer temperature is set to be −20 to 100° C., and preferably to be 0 to 50° C. The gas flow rate of H$_2$ is set to be 0.01 to 0.2 L/min, and preferably to be 0.02 to 0.1 L/min. The gas flow rate of NF$_3$ is set to be 0.02 to 0.2 L/min, and preferably to be 0.07 to 0.18 L/min. The gas flow rate of N$_2$ is set to be 0.2 to 2 L/min, and preferably to be 0.7 to 1.5 L/min. The microwave generation power supply 52 is set at a frequency of 2.45 GHz, and an output of 100 to 1,000 W, and preferably of 200 to 700 W.

Next, an explanation will be given of the heat processing apparatus 15a.

Figure 8:
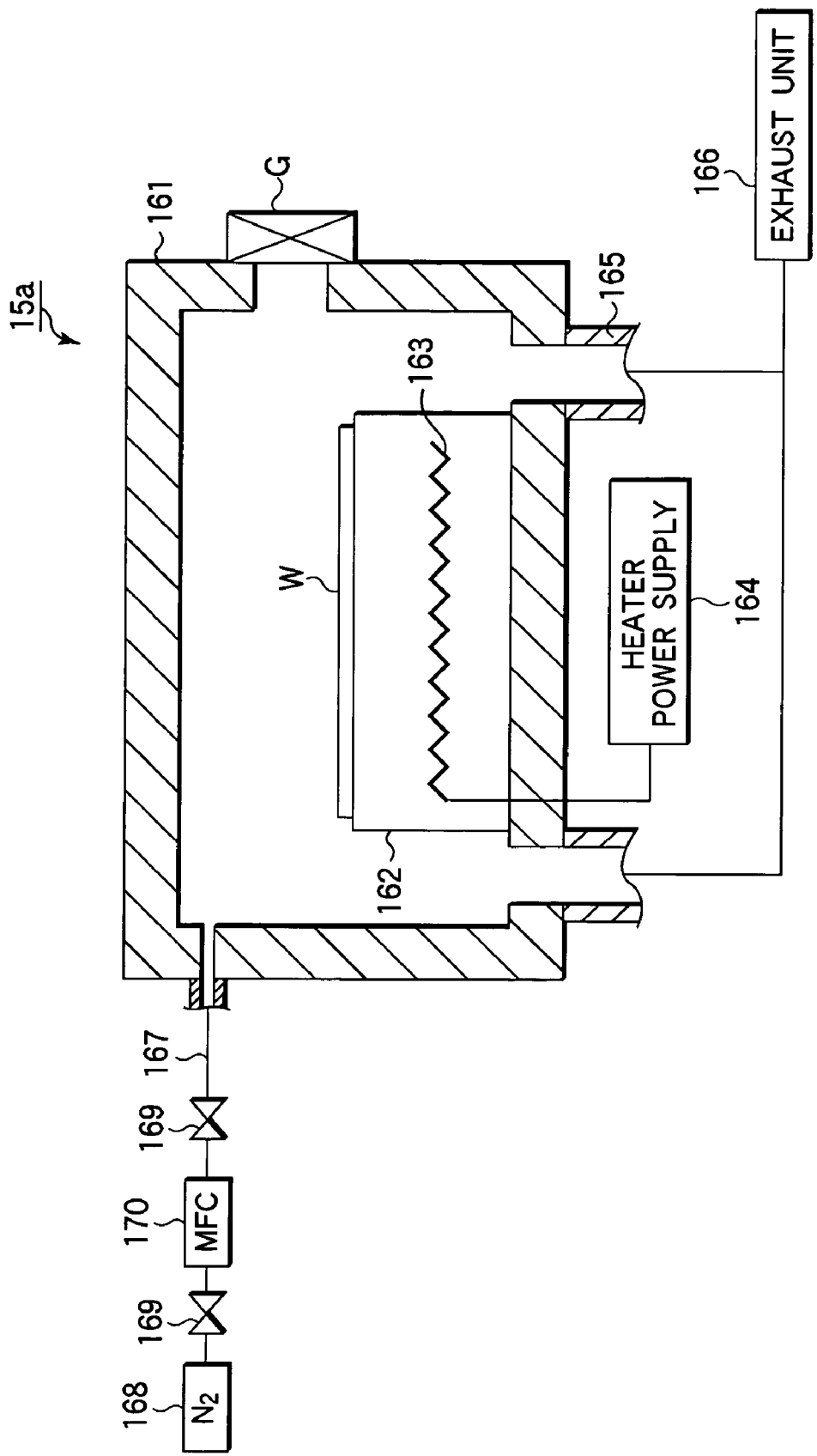
FIG. 8 is a sectional view showing a heat processing apparatus installed in the film formation system shown in FIG. 6.

FIG. 8 is a sectional view showing an example of the structure of the heat processing apparatus 15a. This heat processing apparatus 15a includes an essentially cylindrical airtight chamber 161 for accommodating a wafer W. The chamber 161 is provided with a heating plate 162 disposed therein for placing and heating the wafer W thereon. The heating plate 162 includes a heater 163 embedded therein to heat the wafer W placed thereon. The heater 163 is connected to a heater power supply 164. Further, the heating plate 162 is provided with three wafer support pins (not shown) that can project and retreat relative to the surface of the heating plate 162 to support the wafer W and move it up and down. The wafer support pins are moved by an elevating mechanism having the same structure as that of the elevating mechanism of the Ti film formation apparatus 13 described above.

An exhaust line 165 is connected to the bottom of the chamber 161. The exhaust line 165 is connected to an exhaust unit 166 including a vacuum pump. The exhaust unit 166 is operated to decrease the pressure inside the chamber 161 to a predetermined vacuum level.

An N$_2$ gas supply source 168 is connected through a gas line 167 to the sidewall of the chamber 161. N$_2$ gas used as an inactive gas is supplied from the N$_2$ gas supply source 168 through the gas line 167 into the chamber 161 to perform a heat process within an inactive gas atmosphere. The gas line 167 is provided with a mass-flow controller 170 and two valves 169 one on either side of the controller 170. The inactive gas supplied for this case is not limited to N$_2$ gas, and it may be another inactive gas, such as Ar gas.

A gate valve G, as one of those described above, is disposed on the sidewall of the chamber 161, and a wafer W is transferred between the chamber 161 and the adjacent transfer chamber 11 through the gate valve G in an opened state.

According to the heat processing apparatus 15a described above, while $N_2$ gas used as an inactive gas is supplied into the chamber 161, the wafer W is heated by the heater 163 to a temperature of about 100 to 500° C. In this state, $(NH_4)_2SiF_6$ or the like, which has been generated on the wafer W by the process in the excited gas cleaning apparatus 12a, is thermally decomposed, sublimed, and exhausted.

Figure 9:
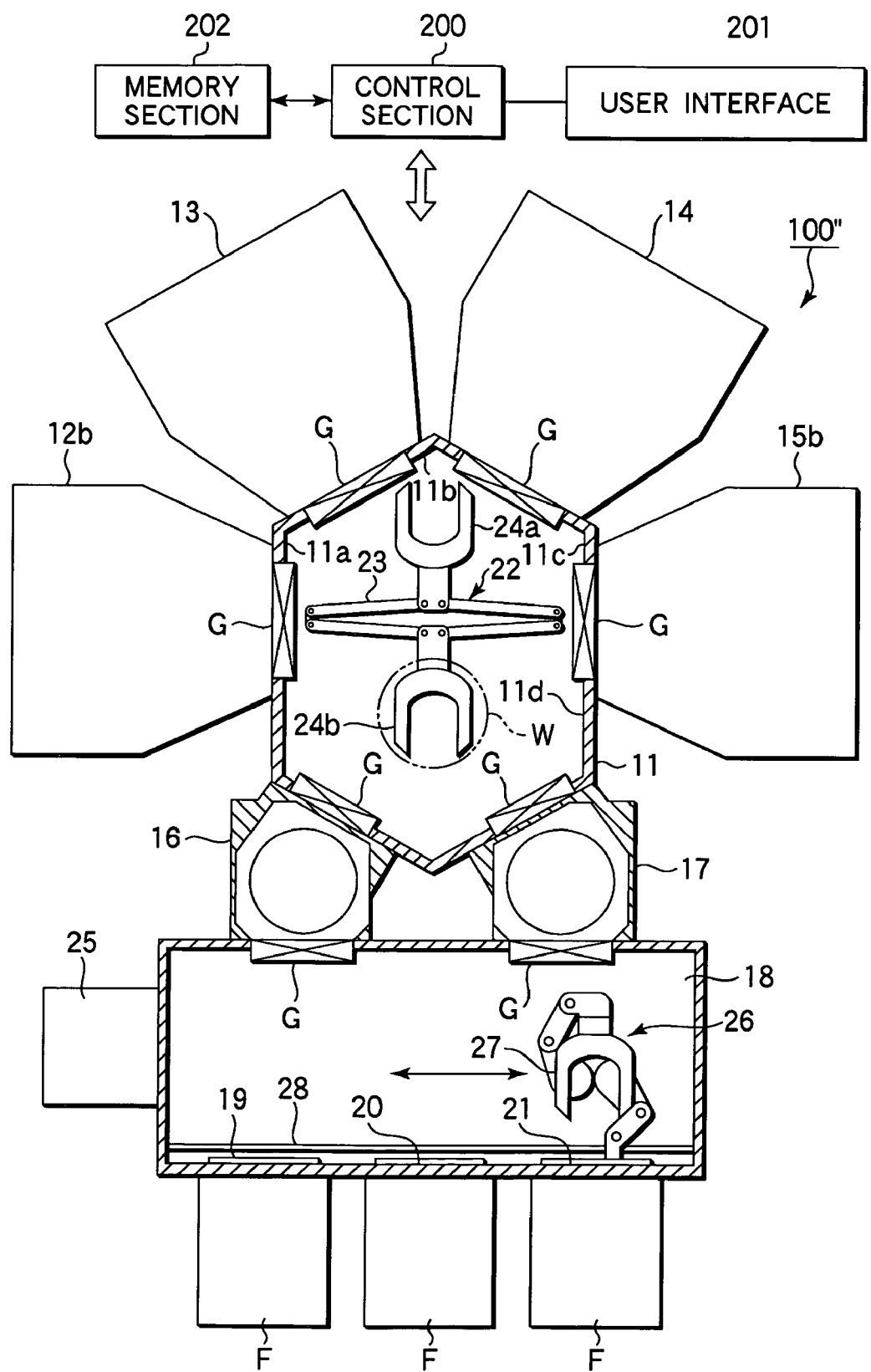
FIG. 9 is a structural view schematically showing a further alternative example of a film formation system of the multi-chamber type for performing a film formation method according to the present invention.

Next, an explanation will be give of a further alternative example of a film formation system. FIG. 9 is a structural view schematically showing a further alternative example of a film formation system of the multi-chamber type.

As shown in FIG. 9, this film formation system 100" employs a reaction gas cleaning apparatus (plasma-less dry cleaning apparatus) 12b in place of the plasma cleaning apparatus 12 of the film formation system 100 for the cleaning process. Further, the film formation system 100" includes a heat processing apparatus 15b disposed at the connection port 11d, which is not connected to any processing apparatus in the film formation system 100. Otherwise, the film formation system 100" has basically the same structure as that of the film formation system 100 described above. Accordingly, the same constituent elements of this system as those of the film formation system 100 are denoted by the same reference numerals, and their explanation will be omitted. This film formation system 100" is operated to perform processes in the same manners as in the film formation system 100 except that the cleaning process is performed by the reaction gas cleaning apparatus 12b and heat processing apparatus 15b.

Next, an explanation will be given of an example of the structure of the reaction gas cleaning apparatus 12b.

Figure 10:
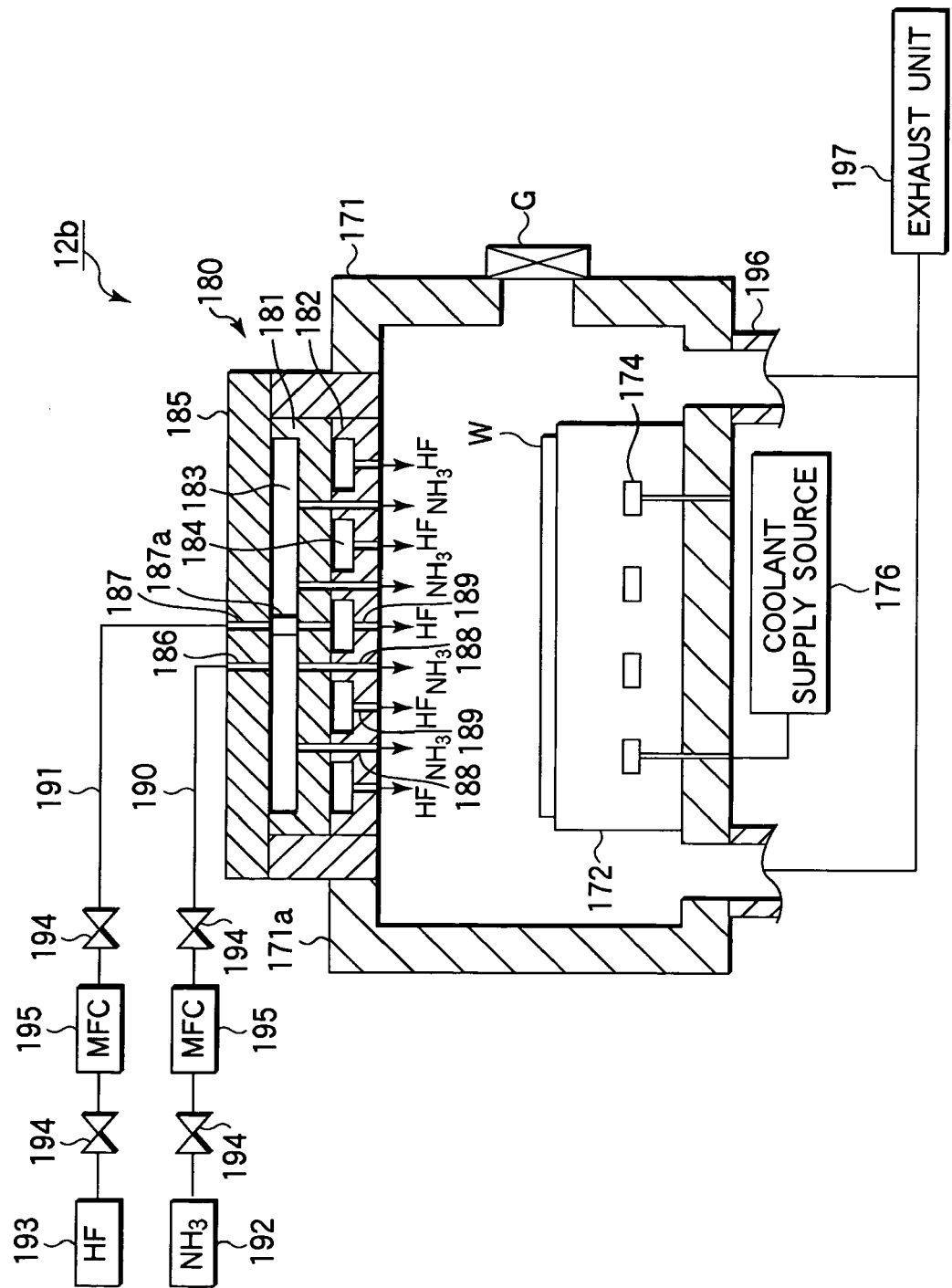
FIG. 10 is a sectional view showing a reaction gas cleaning apparatus installed in the film formation system shown in FIG. 9.

FIG. 10 is a sectional view showing an example of the structure of the reaction gas cleaning apparatus 12b. This reaction gas cleaning apparatus 12b is arranged to perform a cleaning process comprising a chemical reaction by use of a reaction gas.

The reaction gas cleaning apparatus 12b includes an essentially cylindrical airtight chamber 171 for accommodating a wafer W. The chamber 171 is provided with a susceptor 172 disposed therein for supporting a wafer W in a horizontal state. The susceptor 172 is provided with a coolant passage 174 formed therein, in which a coolant is supplied from a coolant supply source 176. The coolant is caused to flow through the coolant passage 174 to control the temperature of the susceptor 172 and further the temperature of the wafer W to be, e.g., a normal temperature. The susceptor 172 may be provided with a heater embedded therein, depending on the coolant temperature and control temperature. Further, the susceptor 172 is provided with three wafer support pins (not shown) that can project and retreat relative to the surface of the susceptor 172 to support the wafer W and move it up and down. The wafer support pins and the elevating mechanism thereof have the same structures as those of the Ti film formation apparatus 13 described above.

A showerhead 180 is disposed on the ceiling 171a of the chamber 171. The showerhead 180 has a two-layer structure formed of a lower layer portion 181 and an upper layer portion 182. The lower layer portion 181 and upper layer portion 182 have a first buffer space 183 and a second buffer space 184, respectively. The upper side of the upper layer portion 182 is closed by a lid member 185, which has an $NH_3$ gas inlet portion 186 for supplying $NH_3$ gas and an HF gas inlet portion 187 for supplying HF gas. The $NH_3$ gas inlet portion 186 is connected to the first buffer space 183, while the HF gas inlet portion 187 is connected to the second buffer space 184 through a gas guide passage 187a. $NH_3$ gas delivery holes 188 are formed to discharge $NH_3$ gas downward from the first buffer space 183. HF gas delivery holes 189 are formed to discharge HF gas downward from the second buffer space 184.

The $NH_3$ gas inlet portion 186 is connected through an $NH_3$ gas line 190 to an $NH_3$ gas supply source 192. $NH_3$ gas is supplied from the $NH_3$ gas supply source 192 through the $NH_3$ gas line 190 to the $NH_3$ gas inlet portion 186. On the other hand, the HF gas inlet portion 187 is connected through an HF gas line 191 to an HF gas supply source 193. HF gas is supplied from the HF gas supply source 193 through the HF gas line 191 to the HF gas inlet portion 187. Each of the gas supply lines is provided with a mass-flow controller 195 and two valves 194 one on either side of the controller 195. $NH_3$ gas and HF gas are respectively supplied to the $NH_3$ gas inlet portion 186 and HF gas inlet portion 187 and flow through passages independent of each other in the showerhead 180, as described above. Then, $NH_3$ gas and HF gas are discharged from the $NH_3$ gas delivery holes 188 and HF gas delivery holes 189, respectively, into the chamber 171. Accordingly, $NH_3$ gas and HF gas are supplied completely independently of each other, in a manner of the post-mix type.

An exhaust line 196 is connected to the bottom of the chamber 171. The exhaust line 196 is connected to an exhaust unit 197 including a vacuum pump. The exhaust unit 197 is operated to decrease the pressure inside the chamber 171 to a predetermined vacuum level.

A gate valve G is disposed on the sidewall of the chamber 171, and a wafer W is transferred between the chamber 171 and the adjacent transfer chamber 11 through the gate valve G in an opened state.

According to the reaction gas cleaning apparatus 12b described above, the interior of the chamber 171 is exhausted to a predetermined vacuum pressure by the exhaust unit 197. In this state, the gate valve G is opened, and a wafer W is transferred by the transfer unit 22 from the transfer chamber 11 in a vacuum state into the chamber 171, and is placed on the susceptor 172. Then, the gate valve G is closed.

The temperature of the wafer W is set at a predetermined temperature by the heater 173 and coolant. In this state, $NH_3$ gas and HF gas are independently supplied at predetermined flow rates from the $NH_3$ gas supply source 192 and HF gas supply source 193 through the $NH_3$ gas line 190 and HF gas line 191, and further through the showerhead 180, into the chamber 171.

These gases provide a chemical action on natural oxide films present on the surface of a nickel silicide film on the wafer W. Consequently, the following reaction proceeds to generate $(NH_4)_2SiF_6$, which is thermally decomposable.

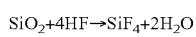

$SiO_2 + 4HF \rightarrow SiF_4 + 2H_2O$

$SiF_4 + 2NH_3 + 2HF \rightarrow (NH_4)_2SiF_6$

After this process, the gate valve G is opened, and the wafer W is unloaded by the transfer unit 22 into the transfer chamber 11. Then, the wafer W is transferred into the heat processing apparatus 15a and is subjected to a heat process. Consequently, the reaction component described above is decomposed and sublimated, and the natural oxide films are thereby removed.

HF gas and $NH_3$ gas are highly reactive with each other, and thus can cause the natural oxide films to be removed efficiently and essentially completely by the reaction described above and the subsequent heat process. Further, only a pure chemical action is used such that HF gas and $NH_3$ gas are supplied to react with the natural oxide films on the surface of the nickel silicide film. This makes it possible to further decrease physical damage to the nickel silicide film serving as an underlayer. In addition, it is possible to effectively remove natural oxide films at the bottom of contact holes and via-holes having a high aspect ratio. Further, inter-level insulating films are less etched or damaged, because of high selectivity for natural oxide films relative to the inter-level insulating films.

The reaction gas cleaning apparatus 12b employs the following process conditions, for example. The process pressure is set to be 0.67 to 133.3 Pa. The wafer temperature is set to be 10 to 30° C. The gas flow rate of $NH_3$ is set to be 10 to 80 mL/min. The gas flow rate of HF is set to be 10 to 80 mL/min.

Next, an explanation will be given of the heat processing apparatus 15b.

The heat processing apparatus 15b has the same structure as that of the heat processing apparatus 15a shown in FIG. 8. Specifically, while the chamber 161 is set to have therein an inactive gas atmosphere of $N_2$ gas or the like, a wafer W is heated to about 100 to 250° C. by the heating plate 162. In this state, $(NH_4)_2SiF_6$ or the like, which has been generated on the wafer W, is thermally decomposed, sublimed, and exhausted, in the form of $SiF_4$, $NH_3$, and HF.

As described above, the natural oxide films on the nickel silicide film are completely removed. However, in this case, since $NH_3$ gas and HF gas are used as reaction gases, N—H family by-products, such as $NH_3F$, are generated at this time, and deposited on the inner wall of the chamber 161.

In order to prevent this problem, it is effective to set the inactive gas, such as $N_2$ gas, at a high temperature, while it is supplied into the chamber 161 during the heat process. Specifically, where $N_2$ gas is supplied at a high temperature of 250° C. or more during the heat process, the inner wall of the chamber 161 is prevented from suffering the deposits. Further, where such a high temperature gas is supplied, the time necessary for performing the heat process on the wafer can be shortened.

Alternatively, it may be arranged to sublimate the deposits at regular intervals or at times when the deposits reach a predetermined amount, in place of the arrangement to constantly supply the inactive gas, such as $N_2$ gas, at a high temperature, during the heat process. In this case, $N_2$ gas is supplied at about 100 to 250° C. into the chamber 161 when the heat process is not performed. Consequently, N—H family by-products, such as $NH_3F$, deposited as sold deposits are sublimed and thereby removed.

Figure 11:
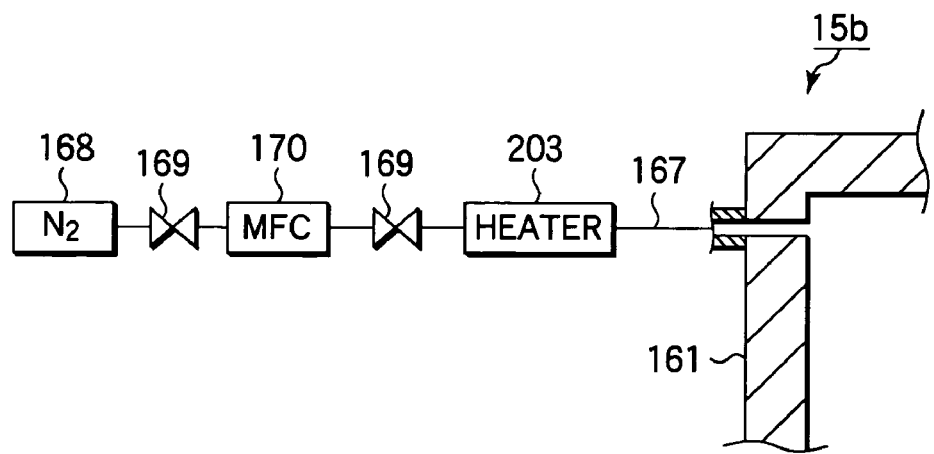
FIG. 11 is a view showing a preferable example of the gas supply system of a heat processing apparatus installed in the film formation system shown in FIG. 9.

For example, in this case, as shown in FIG. 11, the gas line 167 may be provided with a heater 203 for heating $N_2$ gas supplied into the heat processing apparatus 15b.

Next, an explanation will be given of results obtained by actually confirming effects of the present invention.

(1) Effect of Suppressing Film Peeling:

An Si wafer with an insulating film formed thereon was prepared and subjected to the Ti film formation, Ti film nitriding process, and TiN film formation, as described above, using the Ti film formation apparatus 13 shown in FIG. 4 and the TiN film formation apparatus 14 shown in FIG. 5. A sample thus fabricated was then examined in terms of the occurrence of film peeling. In this case, the TiN film thickness was set at a constant value of 20 nm, while the Ti film thickness was set at different values of 2 nm, 5 nm, 7 nm, and 10 nm. The substrate temperature was set at 450° C. in both of the Ti film formation and TiN film formation. The film peeling was judged by visual observation and color change (the portion with film peeling changes the color).

As a result, it was confirmed that samples with Ti film thicknesses of 2 nm, 5 nm, and 7 nm, which fell within the range of the present invention, did not cause any film peeling, because no film peeling or color change was visually observed on them. On the other hand, film peeling and color change were visually observed in a sample with a Ti film thickness of 10 nm, which fell out of the present invention.

(2) Effect of Decreasing Contact Resistance:

Next, a result of measuring the contact resistance will be explained. Specifically, an NiSi film and an insulating film were formed on an Si wafer and a contact hole was formed to reach the NiSi film. Further, the wafer was subjected to the Ti film formation, Ti film nitriding process, and TiN film formation, and further to a W film formation. Then, the contact resistance between the W film and the NiSi film serving as an underlayer was measured. In this case, the substrate temperature was set at 450° C. in both of the Ti film formation and TiN film formation. The TiN film thickness was set at a constant value of 20 nm, while the Ti film thickness was set at different values of 2 nm, 5 nm, and 7 nm, which fell within the range of the present invention. The diameter of the contact hole was set at 0.18 µm in this experiment.

Figure 12:
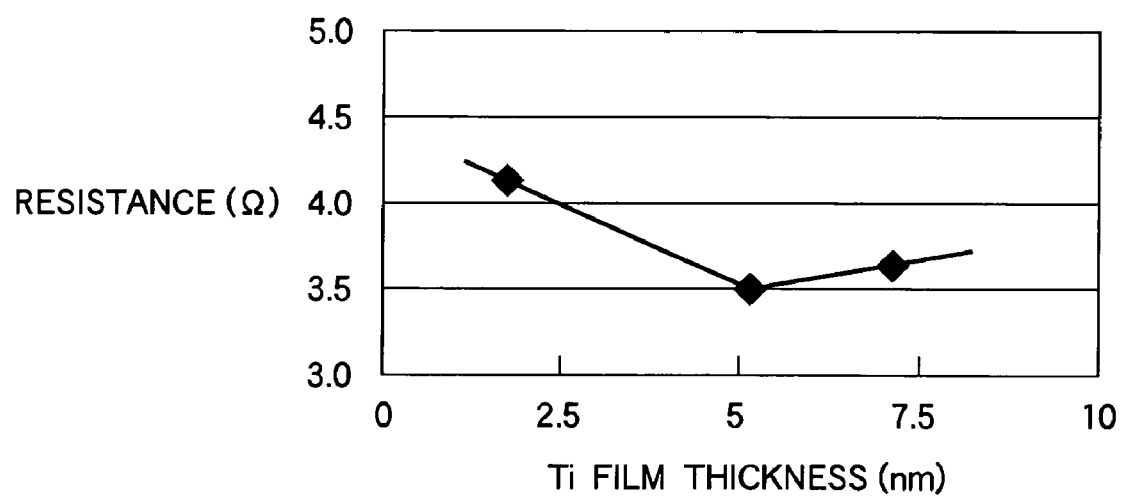
FIG. 12 is a graph showing the relationship between Ti film thickness and contact resistance.

FIG. 12 is a graph showing the relationship between the Ti film thickness and contact resistance. As shown in FIG. 12, it was confirmed that all the samples rendered a contact resistance of 4.2Ω or less, which fell within an acceptable range. Particularly, a sample with a Ti film thickness of 5 nm rendered a good result with a sufficiently low contact resistance of 3.5Ω.

Figure 13:
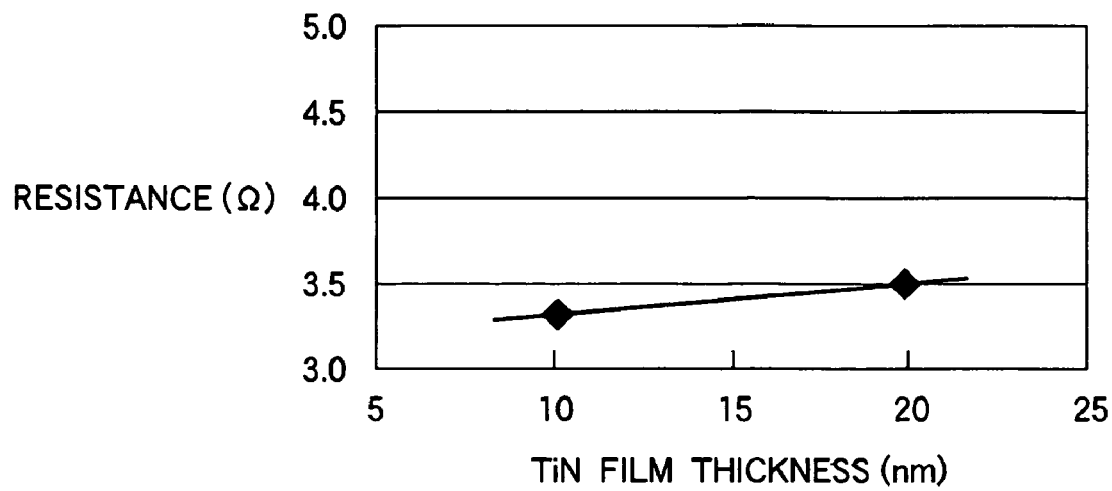
FIG. 13 is a graph showing the relationship between TiN film thickness and contact resistance.

Further, FIG. 13 shows another result of measuring the contact resistance. In this case, the substrate temperature was set at 450° C. in both of the Ti film formation and TiN film formation. The Ti film thickness was set at a constant value of 5 nm, while the TiN film thickness was set at different values of 10 nm and 20 nm, which fell within the range of the present invention. As shown in FIG. 13, all the samples rendered a good result with a sufficiently low contact resistance of 3.5Ω or less.

Figure 14:
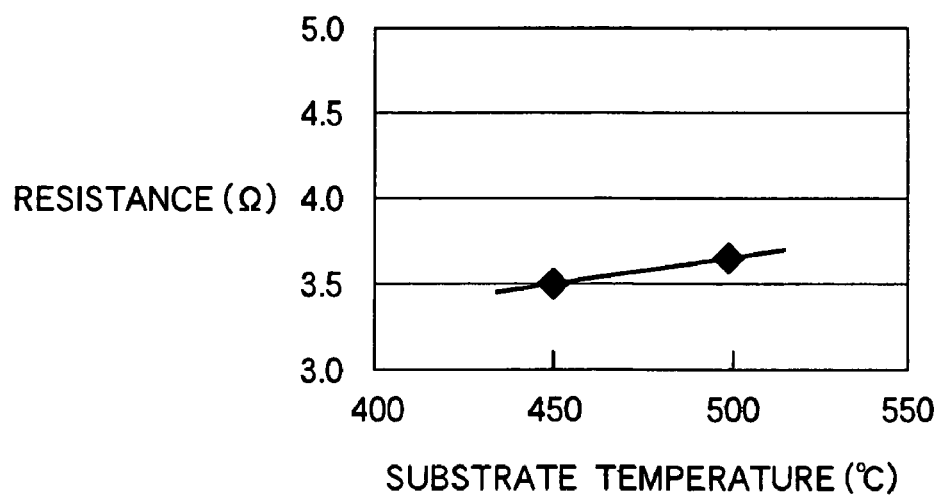
FIG. 14 is a graph showing the relationship between substrate temperature and contact resistance.

Furthermore, FIG. 14 shows another result of measuring the contact resistance. In this case, the Ti film thickness was set at a constant value of 5 nm, and the TiN film thickness was set at a constant value of 20 nm. The substrate temperature was set at different values of 450° C. and 500° C. in both of the Ti film formation and TiN film formation. As shown in FIG. 14, it was confirmed that all the samples rendered a contact resistance, which fell within an acceptable range.

(3) Effect of Suppressing Cracks:

Next, a result of confirming the effect of suppressing cracks obtained by the alternate gas flows described above in the TiN film formation will be explained.

Figure 15:
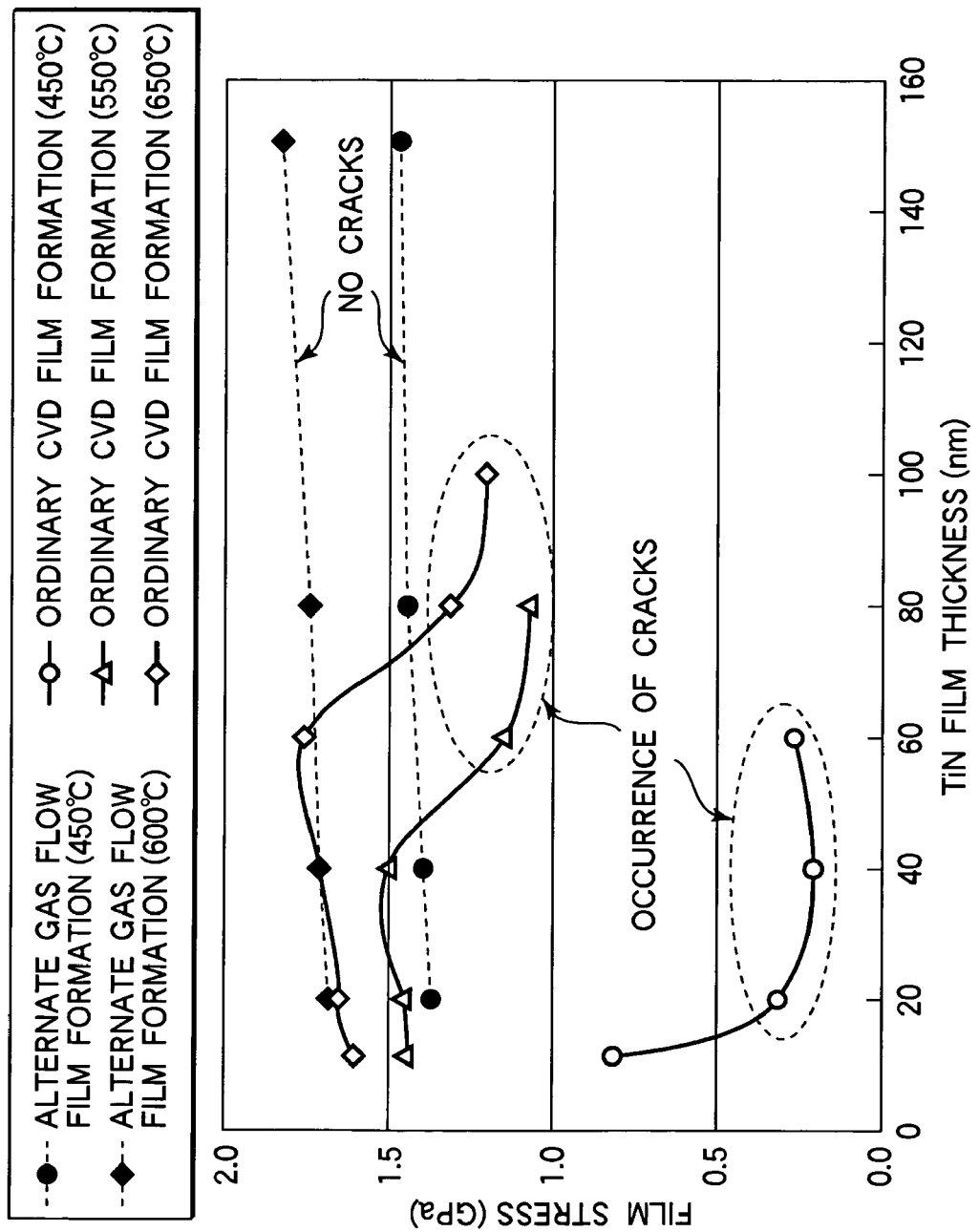
FIG. 15 is a graph showing the relationship between TiN film thickness and TiN film stress.

In this experiment, different TiN film thicknesses and different substrate temperatures in film formation were used in a case where the TiN film formation was performed by the alternate gas flows (alternate gas flow film formation) and in a case where the TiN film formation was performed by ordinary CVD without the alternate gas flows (ordinary CVD film formation). Samples thus fabricated were then examined in terms of the occurrence of cracks in the TiN film. FIG. 15 is a graph showing the relationship between the TiN film thickness and TiN film stress. As shown in FIG. 15, in the case of the conventional CVD film formation with a substrate temperature of 450° C., the stress was not maintained, and thus cracks probably occurred, where the TiN film thickness was 20 nm or more. Similarly, in the case of the conventional CVD film formation with substrate temperatures of 550° C. and 650° C., the stress was not maintained, and thus cracks probably occurred, where the TiN film thickness was 60 nm or more and 80 nm or more, respectively. On the other hand, in the case of the alternate gas flow film formation, the stress was maintained in all the TiN film thicknesses and substrate temperatures. Accordingly, it was confirmed that the alternate gas flows used in the TiN film formation provided the effect of suppressing cracks.

Next, an explanation will be given of an alternative film formation method for performing the Ti film formation and Ti film nitriding process of the stages 2 and 3 described above in the Ti film formation apparatus 13 shown in FIG. 4.

In this case, a cleaning process is performed on the surface of a nickel silicide film serving as an underlayer. Then, first and second steps are alternately performed a plurality of times to perform Ti film formation on the surface. In the first step, a Ti film is formed by use of plasma of $TiCl_4$ gas+Ar gas+$H_2$ gas. In the second step, the film thus formed is subjected to reduction by use of plasma of Ar gas+$H_2$ gas. Then, the Ti film thus treated is subjected to a nitriding process by use of plasma of $NH_3$ gas+Ar gas+$H_2$ gas.

More specifically, as in the Ti film formation described above, the sequence from the pre-coating process to the $TiCl_4$ gas pre-flowing is first performed. Then, the first step is performed for 4 to 8 seconds such that an RF power is applied from the RF power supply 84 to the showerhead 60, and $TiCl_4$ gas, Ar gas, and $H_2$ gas are supplied into the chamber 51 to generate plasma of these gases (first plasma). Then, only $TiCl_4$ gas is stopped, while the RF power, Ar gas, and $H_2$ gas are maintained, so that the second step serving as a reduction process is performed for 2 to 30 seconds by plasma of Ar gas and $H_2$ gas (second plasma). The first and second steps are alternately performed a plurality of times, and preferably three times or more, such as 12 to 24 times. Consequently, a Ti film is formed to have a predetermined thickness. This Ti film formation is low temperature film formation, in which the wafer W is heated at a temperature of 300 to 500° C., and preferably at about 450° C. Further, at this time, the gas flow rate of $TiCl_4$ gas is set to be about 0.01 to 0.1 L/min. The gas flow rate of $H_2$ gas is set to be about 1.0 to 5.0 L/min. The gas flow rate of Ar gas is set to be about 0.5 to 3.0 L/min. The process pressure is set to be about 400 to 1,000 Pa. The RF power supply 84 is set at a power of about 500 to 1,500 W. When the Ti film formation is finished, the supply of RF power and gases is stopped. Then, an RF power is applied again from the RF power supply 84 to the showerhead 60, and $NH_3$ gas, Ar gas, and $H_2$ gas are supplied to perform a nitriding process on the Ti film by plasma of these gases.

As described above, the first and second steps of relatively short time are alternately performed a plurality of times to form a Ti film. At this time, the first step is arranged to perform film formation by use of plasma of $TiCl_4$ gas+Ar gas+$H_2$ gas, and the second step is arranged to perform reduction by use of plasma of Ar gas+$H_2$ gas. Then, the Ti film thus formed is subjected to a nitriding process by use of plasma of $NH_3$ gas+Ar gas+$H_2$ gas. Consequently, the reduction effect of performing reduction of $TiCl_4$ is enhanced, and the residual chlorine concentration in the Ti film is thereby decreased to provide the Ti film with a low resistivity and good quality.

Also in a case where the Ti film formation is performed by such alternate gas flows, the film thickness is set to be not less than 2 nm but less than 10 nm. With this arrangement, a reaction layer of the Ti film with the NiSi film serving as an underlayer and having a cleaned surface is preferably formed to decrease the contact resistance. Consequently, even where the film formation is performed at a low temperature of 500° C. or less, a low contact resistance is obtained. Further, since the Ti film is sufficiently nitrided, the Ti film is prevented from being etched in the subsequent TiN film formation, thereby improving the adhesion and suppressing the film peeling on the Ti film.

The present invention is not limited to the embodiments described above, and it may be modified in various manners. For example, in the embodiments described above, a nickel silicide film is used as an underlying metal silicide film below a Ti/TiN film. Alternatively, a silicide of a metal, such as Co, Mo, W, Pt, or Pd, may be used as a metal silicide on the substrate surface. Further, the same effect can be obtained, for example, where an upper wiring layer forms contact with an impurity diffusion layer of an Si substrate, other than the metal silicide film. Furthermore, the Ti compound is not limited to $TiCl_4$, and it may be another compound, such as another halogen compound, e.g., $TiF_4$ or $TiI_4$, or an organic Ti compound. The gas containing N and H is not limited to $NH_3$ gas, and it may be a mixture gas of $N_2$ and $H_2$ or $N_2H_2$ gas.

The apparatus and gas type used for the cleaning process are not limited to those of the embodiments described above. Further, in the embodiments described above, the target substrate is exemplified by a semiconductor wafer, which is not limiting. For example, the target substrate may be another substrate, such as a substrate for flat panel display (FPD) devices, represented by liquid crystal display devices.

INDUSTRIAL APPLICABILITY

According to the present invention, even where the film formation is performed at a low temperature in forming a Ti film and a TiN film on an Si substrate or a metal silicide film disposed on a substrate, it is possible to decrease the contact resistance and to prevent the film peeling. Accordingly, the present invention is preferably applied to formation of contact structures, such as contact holes and via-holes of semiconductor devices.

The invention claimed is:

1. A film formation method for forming a Ti film and a TiN film on an underlayer comprising an Si-containing substrate or a metal silicide film disposed on a substrate, the film formation method comprising:
   cleaning a surface of the underlayer;
   forming a Ti film to have a film thickness of not less than 2 nm but less than 10 nm on the underlayer by CVD using a Ti compound gas;
   nitriding the Ti film; and
   forming a TiN film on the Ti film thus nitrided, by CVD using a Ti compound gas and a gas containing N and H,
   wherein said cleaning a surface of the underlayer comprises removing a natural oxide film of Si present on the surface of the underlayer, and said removing a natural oxide film comprises,
   supplying HF gas and $NH_3$ gas onto the surface of the underlayer without generating plasma thereof to cause the HF gas and the $NH_3$ gas to chemically react with the natural oxide film, thereby turning the natural oxide film into an intermediate product film that is thermally decomposable, and
   them performing a heat process of heating the intermediate product film at a certain temperature, thereby thermally decomposing the intermediate product film while vaporizing and exhausting decomposition products thus generated.

2. The film formation method for Ti and TiN films according to claim 1, wherein the TiN film is set to have a film thickness of 3 nm or more and 50 nm or less.

3. The film formation method for Ti and TiN films according to claim 1, wherein said forming a Ti film is performed at a substrate temperature of 300 to 500° C.

4. The film formation method for Ti and TiN films according to claim 1, wherein the metal silicide is silicide of a metal selected from the group consisting of Ni, Co, Mo, W, Pt, and Pd.

5. A film formation method for forming a Ti film and a TiN film on an underlayer comprising an Si-containing substrate or a metal silicide film disposed on a substrate, the film formation method comprising:

cleaning a surface of the underlayer;

forming a Ti film to have a film thickness of not less than 2 nm but less than 10 nm by CVD using a Ti compound gas;

nitriding the Ti film; and forming a TiN film on the Ti film thus nitrided, by alternately repeating, a plurality of times, a first step of supplying a Ti compound gas and a gas containing N and H, and a second step of stopping the Ti compound gas and supplying the gas containing N and H, wherein said cleaning a surface of the underlayer comprises removing a natural oxide film of Si present on the surface of the underlayer, and said removing a natural oxide film comprises, supplying HF gas and $NH_3$ gas onto the surface of the underlayer without generating plasma thereof to cause the HF gas and the $NH_3$ gas to chemically react with the natural oxide film, thereby turning the natural oxide film into an intermediate product film that is thermally decomposable, and then performing a heat process of heating the intermediate product film at a certain temperature, thereby thermally decomposing the intermediate product film while vaporizing and exhausting decomposition products thus generated.

6. A film formation method for forming a Ti film and a TiN film on a nickel silicide film disposed on a substrate, the film formation method comprising:

cleaning a surface of the nickel silicide film;

forming a Ti film to have a film thickness of not less than 2 nm but less than 10 nm by CVD using a Ti compound gas, and thereby forming a reaction layer of nickel silicide with Ti at an interface between the nickel silicide film and the Ti film;

nitriding the Ti film; and forming a TiN film on the Ti film thus nitrided, by alternately repeating, a plurality of times, a first step of supplying a Ti compound gas and a gas containing N and H, and a second step of stopping the Ti compound gas and supplying the gas containing N and H wherein said cleaning a surface of the nickel silicide film comprises removing a natural oxide film of Si present on the surface of the nickel silicide film, and said removing a natural oxide film comprises, supplying HF gas and $NH_3$ gas onto the surface of the nickel silicide film without generating plasma thereof to cause the HF gas and the $NH_3$ gas to chemically react with the natural oxide film, thereby turning the natural oxide film into an intermediate product film that is thermally decomposable, and then performing a heat process of heating the intermediate product film at a certain temperature, thereby thermally decomposing the intermediate product film while vaporizing and exhausting decomposition products thus generated.

7. The film formation method for Ti and TiN films according to claim 6, wherein the TiN film is set to have a film thickness of 3 nm or more and 50 nm or less.

8. The film formation method for Ti and TiN films according to claim 6, wherein said forming a Ti film is performed at a substrate temperature of 300 to 500° C.

9. A computer readable storage medium that stores a software for a computer to execute a control program, which, when executed, controls a film formation system to perform a film formation method for forming a Ti film and a TiN film on an underlayer comprising an Si-containing substrate or a metal silicide film disposed on a substrate, the film formation method comprising:

cleaning a surface of the layer;

forming a Ti film to have a film thickness of not less than 2 nm but less than 10 nm on the underlayer by CVD using a Ti compound gas;

nitriding the Ti film; and forming a TiN film on the Ti film thus nitrided, by CVD using a Ti compound gas and a gas containing N and H, wherein said cleaning a surface of the underlayer comprises removing a natural oxide film of Si present on the surface of the underlayer, and said removing a natural oxide film comprises, supplying HF gas and $NH_3$ gas onto the surface of the underlayer without generating plasma thereof to cause the HF gas and the $NH_3$ gas to chemically react with the natural oxide film, thereby turning the natural oxide film into an intermediate product film that is thermally decomposable, and then performing a heat process of heating the intermediate product film at a certain temperature, thereby thermally decomposing the intermediate product film while vaporizing and exhausting decomposition products thus generated.

10. The film formation method for Ti and TiN films according to claim 1, wherein the intermediate product film comprises $(NH_4)_2SiF_6$, and the certain temperature is set to be 100 to 250° C.

11. The film formation method for Ti and TIN films according to claim 10, wherein the substrate is set at a temperature of 10 to 30° C. during said turning the natural oxide film into an intermediate product film.

12. The film formation method for Ti and TIN films according to claim 1, wherein the heat process comprises heating the substrate at the certain temperature inside a process chamber and supplying an inactive gas heated at a temperature, which is capable of thermally decomposing the intermediate product film, into the process chamber.

13. The film formation method for Ti and TiN films according to claim 6, wherein the intermediated product film comprises $(NH_4)_2SiF_6$, and the certain temperature is set to be 100 to 250° C.

14. The film formation method for Ti and TiN films according to claim 13, wherein the substrate is set at a temperature of 10 to 30° C. during said turning the natural oxide film into an intermediate product film.

15. The film formation method for Ti and TIN films according to claim 6, wherein the heat process comprises heating the substrate at the certain temperature inside a process chamber and supplying an inactive gas heated at a temperature, which is capable of thermally decomposing the intermediate product film, into the process chamber.

* * * * *